United States Patent
Kim et al.

(10) Patent No.: US 9,594,286 B2
(45) Date of Patent: Mar. 14, 2017

(54) TRANSPARENT DISPLAY APPARATUS WITH ADJUSTABLE TRANSMISSIVE AREA AND A METHOD FOR CONTROLLING THE SAME

(71) Applicant: LG Display Co., Ltd., Seoul (KR)

(72) Inventors: IlHo Kim, Paju-si (KR); JungHoon Seo, Goyang-si (KR); KiPyo Hong, Goyang-si (KR); ByungChun Yu, Paju-si (KR); SangLyn Lee, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 394 days.

(21) Appl. No.: 14/140,187

(22) Filed: Dec. 24, 2013

(65) Prior Publication Data

US 2014/0185129 A1    Jul. 3, 2014

(30) Foreign Application Priority Data

Dec. 31, 2012    (KR) .................. 10-2012-0157792

(51) Int. Cl.
*G02B 26/00* (2006.01)
*G02F 1/167* (2006.01)
*H01L 51/52* (2006.01)

(52) U.S. Cl.
CPC .......... *G02F 1/167* (2013.01); *H01L 51/5284* (2013.01); *G02F 2201/44* (2013.01); *G02F 2203/01* (2013.01); *H01L 2251/5315* (2013.01)

(58) Field of Classification Search
CPC ................ G02F 1/167; G02F 1/13306; G02F 2001/1678; G02F 2001/1672;
(Continued)

(56) References Cited

U.S. PATENT DOCUMENTS

2007/0132713 A1*  6/2007 Seo .................. G02F 1/167
                                                    345/107
2009/0244413 A1   10/2009 Ishikawa et al.
(Continued)

FOREIGN PATENT DOCUMENTS

JP         2011-237696 A     11/2011
KR   10-2008-0056932 A      6/2008
(Continued)

OTHER PUBLICATIONS

PCT International Search Report for PCT/KR2013/012283, Apr. 29, 2014, 3 Pages.

*Primary Examiner* — Bumsuk Won
*Assistant Examiner* — Tamara Y Washington
(74) *Attorney, Agent, or Firm* — Fenwick & West LLP

(57) ABSTRACT

There are provided a transparent display apparatus and a method for controlling the same. The transparent display apparatus includes a transparent display unit that includes a plurality of first pixels having an emissive area on which an image is displayed and a transmissive area on which a background is projected; a light control unit that includes a plurality of second pixels disposed on one surface of the transparent display unit; and a transmittance control device that extracts at least one object from an image displayed by the transparent display unit and controls transmittance of an area, which corresponds to the light control unit and the extracted object.

21 Claims, 14 Drawing Sheets

(58) Field of Classification Search
CPC ........ G02F 2001/1676; H04N 1/00334; H04N 1/00453; G06K 7/10831
USPC ................ 359/290–298, 237–240, 265–274; 345/207
See application file for complete search history.

(56) References Cited

U.S. PATENT DOCUMENTS

| | | | |
|---|---|---|---|
| 2010/0078329 A1* | 4/2010 | Mirsky | C25D 11/26 |
| | | | 205/82 |
| 2010/0230493 A1* | 9/2010 | Akiyama | G06K 7/14 |
| | | | 235/437 |
| 2011/0260965 A1 | 10/2011 | Kim et al. | |
| 2012/0327331 A1* | 12/2012 | Yim | G02F 1/1362 |
| | | | 349/62 |
| 2013/0063471 A1 | 3/2013 | Sugiyama et al. | |
| 2014/0028968 A1* | 1/2014 | Olsson | G06F 1/163 |
| | | | 351/158 |

FOREIGN PATENT DOCUMENTS

| | | |
|---|---|---|
| KR | 10-2011-0117966 A | 10/2011 |
| WO | WO 2005/024501 A1 | 3/2005 |

* cited by examiner

TRANSPARENT DISPLAY APPARATUS WITH ADJUSTABLE TRANSMISSIVE AREA AND A METHOD FOR CONTROLLING THE SAME

CROSS-REFERENCE TO RELATED APPLICATIONS

This application claims the priority of Korean Patent Application No. 2012-0157792 filed on Dec. 31, 2012, in the Korean Intellectual Property Office, the disclosure of which is incorporated herein by reference in its entirety.

BACKGROUND OF THE INVENTION

1. Field of the Invention

The present invention relates to a transparent display apparatus and a method for controlling the same, and more particularly, to a transparent display apparatus and a method for reducing light interference to improve visibility of images displayed on the transparent display apparatus.

2. Description of the Related Art

A transparent display apparatus allows a user to see objects placed behind the display device while viewing the image displayed by the display device. Although there have been attempts to provide transparent display device with a liquid-crystal display (LCD), the two polarizing plates included in the LCD display significantly reduces the light transmittance rate through the display device. Accordingly, it is extremely difficult to implement transparent display apparatus with LCD based display device.

Display devices employing organic light-emitting diode (OLED) do not require such polarizing plates as the LCD display device. For this reason, the OLED based display device has been considered as the promising component in implementing a transparent display apparatus.

Such a transparent display apparatus can be applied as a front glass for a vehicle or as a smart window for a house for displaying information while allowing the user to view the outside environment through the transparent display.

In this case, however, the visibility of the information displayed on the transparent display apparatus is often degraded by certain degree depending on the brightness of the environment. More specifically, it becomes difficult for the user to see the image on the display device when the external light at entering from the rear side of the transparent display apparatus is excessively brighter than the light emitted from the display device. More specifically, it becomes difficult for the user to recognize the information displayed on the transparent display device when the external light entering from the rear side of the display apparatus is excessively brighter than the light emitted from the display device itself.

Attempts have been made to solve the aforementioned problem by shielding the external light entering from the rear side of the entire transparent display apparatus. This method, however, prevents the user to see the outside environment through the display device, significantly limiting the user experience in using the transparent display device, thereby defeating the purpose of having the transparent display apparatus.

Accordingly, there remains a need for a transparent display device capable of maintaining both the visibility of the displayed image as well as the transparency of the display device.

SUMMARY OF THE INVENTION

Embodiments of the present disclosure relate to a transparent display apparatus having a transmittance to external light that is adjustable depending in an area corresponding to an object displayed on the transparent display apparatus. In one embodiment, the transparent display apparatus, comprises a transparent display unit having an emissive area for display of an image and a transmissive area for transmitting at least a portion of external light incident on the transparent display apparatus. At least one control device identifies an object in the image and controls adjustment of the portion of the external light transmitted through the transmissive area of the transparent display unit in an object area corresponding to the object.

In one embodiment, the transparent display apparatus comprises a light control unit overlapping with the transparent display unit. The light control unit has an adjustable transmittance to the external light, and the control device controls adjustment of the portion of the external light transmitted through the transmissive area of the transparent display unit by controlling adjustment of the adjustable transmittance of the light control unit in the object area corresponding to the object.

In one embodiment, the control device controls adjustment of the adjustable transmittance of the light control unit in the object area based on at least one characteristic of the object. For example, the characteristic can be a size of the object, a luminance of the object, a type of the object, a movement of the object or a color of the object.

In one embodiment the transparent display unit comprises a plurality of first pixels that include the emissive area and the transmissive area, and the light control unit comprises a plurality of second pixels. The plurality of first pixels and the plurality of second pixels may be different in number and size.

In one embodiment, the transmittance control device is configured to control the adjustable transmittance of the light control unit to a first transmittance level in a first portion of the object area within a boundary of the object and to control the adjustable transmittance of the light control unit to a second transmittance level different than the first transmittance level in a second portion of the object area outside of the boundary of the object. The second transmittance level may be higher than the second transmittance level.

In one embodiment, a size of the object area corresponding to the object is same as a size of the object. In another embodiment, the object area corresponding to the object is larger than and surrounds a boundary of the object on all sides by a pre-determined number of pixels.

In one embodiment, the control device identifies the object in the image with an image matching algorithm. In another embodiment, the control device identifies the object in the image based on coordinates indicating a position of the object.

In another embodiment, a method of operation in the transparent display apparatus is disclosed. The method comprises identifying an object in an image, the image for display on an emissive area of the transparent display apparatus, the transparent display apparatus also including a transmissive area for transmitting at least a portion of external light incident on the transparent display apparatus. The image is displayed in the emissive area of the transparent display unit. The portion of the external light transmitted through the transmissive area of the transparent display unit in an object area corresponding to the object is adjusted. In a further embodiment, a non-transitory computer readable medium stores instructions that when executed by a processor, cause the processor to perform the method.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Figure 1:
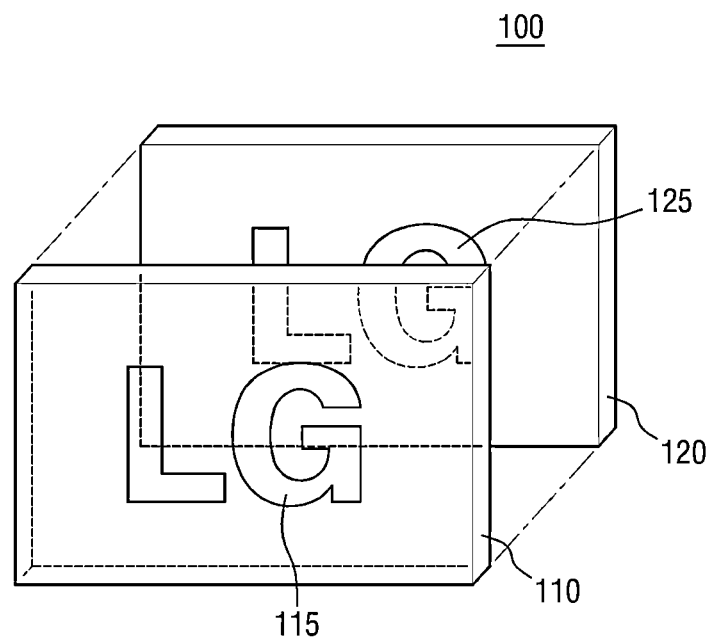
FIG. 1 is a schematic diagram of a transparent display apparatus.

Various advantages and features of the present invention and methods accomplishing thereof will become apparent from the following description of embodiments with reference to the accompanying drawings. However, the present invention is not limited to embodiments disclosed herein but will be implemented in various forms. The embodiments are provided by way of example only so that a person of ordinary skilled in the art can fully understand the disclosures of the present invention and the scope of the present invention. Therefore, the present invention will be defined only by the scope of the appended claims.

Indicating that elements or layers are "on" other elements or layers include both a case in which the corresponding elements are just above other elements and a case in which the corresponding elements are intervened with other layers or elements.

Although first, second, and the like are used in order to describe various components, the components are not limited by the terms. The above terms are used only to discriminate one component from the other component. Therefore, a first component mentioned below may be a second component within the technical spirit of the present invention.

In the drawings, size and thickness of each element are arbitrarily illustrated for convenience of description, and the present invention is not necessarily limited to those illustrated in the drawings.

Hereinafter, embodiments of the present invention will be described with reference to the accompanying drawings.

FIG. 1 is a schematic diagram of a transparent display apparatus. As shown in FIG. 1, the transparent display apparatus 100 includes a transparent display unit 110 and a light control unit 120.

The transparent display apparatus 100 is configured to emit light from its pixels while transmitting external light through the transparent display apparatus 100. The external light passed through the display apparatus 100 allows the user to simultaneously recognize the image displayed by the display apparatus and the view behind the display apparatus 100. The user receives image information delivered by the external light passed through the transparent display and image information delivered by the light emitted from the display.

The external light through the transparent display and the light emitted by the display become a blended image and delivered to the user. The term "information" means that information contained within the image which is to be seen to users. The term "visibility" means a certain degree of recognition of the information.

Information delivered to the user is divided into information displayed on the transparent display apparatus 100 and information from the view through the rear side of the transparent display apparatus 100.

Regarding the overall visibility of the blended image on the transparent display apparatus 100, the visibility of the image displayed by the transparent display apparatus 100 and the visibility of the view behind the display apparatus 100 through the transparent display apparatus 100 are independently considered.

The transparent display apparatus 100 is configured to maintain the good visibility of the image displayed by the transparent display apparatus 100 as well as the visibility of the view behind the display apparatus 100.

Illuminance level of an ambient environment affects the visibility of the image displayed by display apparatus 100. The amount of light is measured in lux unit by a light sensor. For example, the illuminance in an office ranges from about 200 to 500 lux, the illuminance in the shade of a building or forest in the daytime ranges from about 20,000 to 30,000 lux, and the illuminance in the sun in the daytime ranges from about 50,000 to 100,000 lux.

The transparent display unit 110 comprises an emissive area and a transmissive area adjacent to the emissive area. The maximum brightness of the emissive area is limited by the transparent display unit 110. In general, the brightness of the emissive area is very lower than the brightness of the sun light. That is, the ambient light through the transmissive area could be much brighter than the light from the emissive area depending on the ambient environment.

The term "visibility" also can be explained in terms of "contrast ratio of the image". The problem occurs when the transmissive area is much brighter than the emissive area. The light through the transmissive area affects the neighboring emissive areas causes the neighboring emissive areas to become brighter due to diffusion and/or diffraction of light. Consequently, the emissive areas become brighter and the contrast ratio becomes decreased and the visibility is degraded such that it is difficult to differentiate the image and the view.

The non-transparent display apparatus has attempted to suppress the front surface reflection of the display apparatus under the high illuminance environment. However, such a configuration only considers light reflected from a front surface of the display apparatus. In the transparent display apparatus 100, light entering from the rear side as well as the light reflected from the front surface is taken account of. Further, since the light entering from the rear side of the transparent display apparatus 100 is not a source of interference for the image to be displayed on the display apparatus 100 but also includes information of behind view that the user intended to see, the luminance of an image displayed by the transparent display apparatus and the light entering from the rear side need to be maintained under the various illuminance conditions.

In an embodiment, the transparent display apparatus 100 controls transmittance of an object 115 displayed on the transparent display unit 110 so as to ensure the visibility of the object 115 and ensure the visibility of the view behind the transparent display apparatus 100 at the same time.

In the present disclosure, the term "transmittance" refers a value obtained by dividing the amount of light passed-through the transparent display unit 110 by the amount of light exposed on the rear side of the light control unit 120.

In the present disclosure, the term "object" refers to an object within the image displayed on the display apparatus 110, which contains information. The object 115 includes all objects capable of being displayed on the display apparatus. That is, any object may be defined as the object 115 in the present disclosure as long as at least one characteristic of the object 115 can be distinguished from its surroundings. The characteristic of the object 115 could be at least one of form, shape, color, illuminance, contrast, size, position, contour, a degree of importance, type, and movement. The object can be recognized from the surroundings. That is, the object 115 may include all distinguishable objects within the image displayed by the transparent display unit 110. The object may include a background, a person, a text, an icon, and a program window. When the visibility of the object 115 within the displayed video is degraded, it may be difficult for a user to obtain desired information from the transparent display apparatus.

The object 115 is displayed on the display unit 110 of the transparent display apparatus 100.

The transparent display unit 110 is a transparent organic light-emitting display device. The organic light-emitting display device is a display apparatus configured to cause an organic light-emitting layer to emit by current flow through the organic light-emitting layer. The transparent organic light-emitting display device emits light having a certain wavelength by using the organic light-emitting layer. The transparent organic light-emitting display device includes at least a cathode, the organic light-emitting layer, and an anode. The light control unit 120 has an adjustable transmittance for external light and controls the transmittance of an area corresponding to the object. The light control unit 120 improves the visibility of the object 115 by controlling transmittance of an area 125 corresponding to the object. Furthermore, improvement of the visibility of the object 115 improves the visibility of the displayed video.

The area 125 corresponding to the object means an area determined by a boundary of the object 115. A boundary of the object 115 includes area 125 corresponding to the object and may additionally include a surrounding area of the object 115. The surrounding area of the object 115 is formed by extending the boundary of the object 115 to the outside of the object 115. The surrounding area of the object 115 may be an area formed by extending from the boundary of the object 115 to the outside by at least one pixel or more. By setting the surrounding area of the object, the transparent display apparatus 100 can improve the low visibility problem due to light incident on the transmissive area adjacent to the boundary of the object or arbitrarily emphasize the object.

The light control unit 120 is configured to change a path of light incident on the light control unit 120 by transmitting, scattering, absorbing or shielding the light, or change characteristics of the light.

The controlling of the transmittance of the light incident on the transparent display apparatus 100 is closely relevant to whether the incident external light is absorbed or passes through the transparent display apparatus. If reflectivity of the light control unit 120 is high, even though the light from the rear side of the transparent display apparatus 100 can be blocked, the visibility of the transparent display apparatus 100 is degraded. Accordingly, the light control unit 120 may have a transmittance of 1% to 90%, and the reflectivity of the light control unit 120 may be 10% or less.

Furthermore, the light control unit 120 may be a MEMS (Micro Electro Mechanical System) device. The MEMS device includes a substrate, thin-film layers, an air layer, and a reflection film layer. In the MEMS device, a screen is displayed according to two states of an open state and a collapsed state. In the MEMS device, when a voltage is not applied, the thin-film layers are separated, so that selective reflection can be carried out. When a low voltage is applied to generate an electrostatic force, the reflection film layer is moved to absorb light.

Furthermore, the light control unit 120 may be an electro wetting device or an electro chromic device. However, for the sake of convenience in description, a case where the light control unit 120 is a light control unit 120 in which transmittance is determined by charged particles, will be described below.

Referring to FIG. 1, for sake of convenience in description, although the transparent display unit 110 and the light control unit 120 are distanced from each other, the transparent display unit 110 and the light control unit 120 may be bonded by an adhesive or glue or may be positioned sufficiently close to each other so as to be driven as a transparent display apparatus 100.

Since the light control unit 120 and the transparent display unit 110 have the same resolution, an area displayed by the transparent display unit 110 and an area controlled by the light control unit 120 are substantially the same. Alternatively, the transparent display unit 110 and the light control unit 120 may have different resolutions. For example, the resolution of the light control unit 120 may be lower than the resolution of the transparent display unit 110. In such a case, an algorithm for allowing the resolution of the transparent display unit 110 to be compatible with the resolution of the light control unit 120 may be further provided.

The light control unit 120 of the transparent display apparatus 100 may be changed in design depending on a type of the transparent display unit 110. Specifically, an area ratio of the transmissive area to the emissive area of the transparent display apparatus 100 may be changed depending on whether or not the type of the transparent display unit is a top emission type, a bottom emission type or a double-side emission type. Driving wires of the light control unit 120 may be arranged within the emissive area other than the transmissive area in order to improve the transmittance.

Referring to FIG. 1, in the transparent display apparatus 100 according to the embodiment of the present invention, the transparent display unit 110 and the light control unit 120 are overlapping and disposed close to each other or come in contact with each other as stated above. The object 115 is displayed on the transparent display unit 110. The transmittance of the area 125 corresponding to the object may be controlled by the light control unit 120, thereby adjusting the portion of the external light passing through the transparent display unit 110.

In the transparent display apparatus 100, the transmittance of the area 125 corresponding to the object is decreased to decrease the portion of the external light passing through the transparent display unit 110. Since the visibility of the object 115 is improved by decreasing the transmittance of the area 125 corresponding to the object, the user can clearly recognize the displayed object 115 and maintain the informativeness of the background on the rear side of the transparent display apparatus 100.

Hereinafter, a specific configuration of the transparent display apparatus according to an embodiment of the present invention will be described.

Figure 2A:
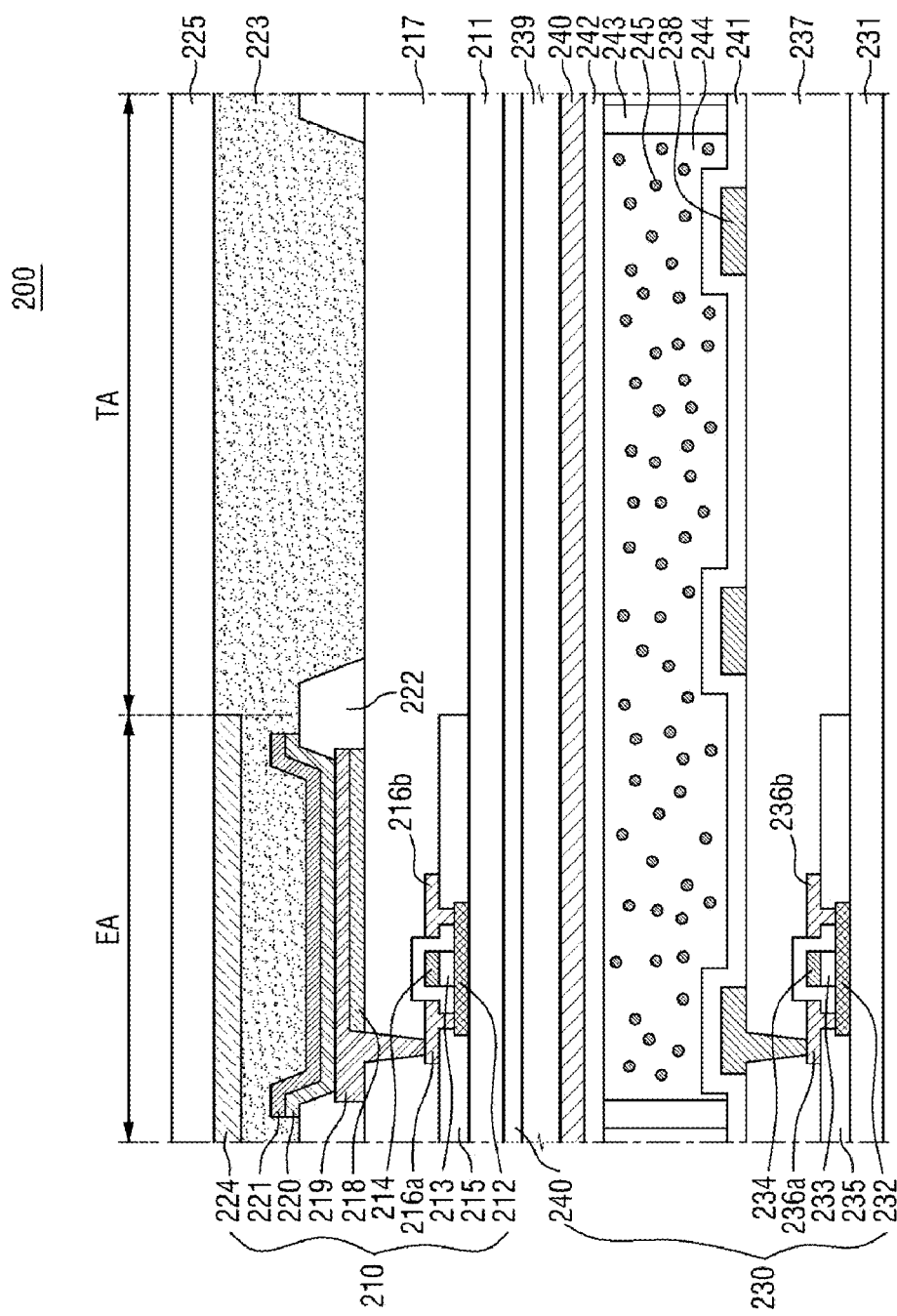
FIG. 2A is a schematic cross-sectional view of a transparent display apparatus according to an embodiment of the present invention.

FIG. 2A is a schematic cross-sectional view of a transparent display apparatus depicted in FIG. 1 according to an embodiment of the present invention. FIG. 2A illustrates a transparent display unit 210 and a light control unit 230. The transparent display unit 210 may be a transparent organic light-emitting display device in which an image is displayed, and the light control unit 230 may be a charged-particle control device in which transmittance is controlled.

The transparent display unit 210 includes an emissive area EA and a transmissive area TA.

The emissive area EA is an area where display light is emitted, and the transmissive area TA is an area where a portion of light representing the view behind of transparent display apparatus 200 is transmitted. Since the transmissive area TA is adjacent to the emissive area EA, when light incident on the transmissive area TA is excessively bright, the intensity of light in the adjacent emissive area EA appears relatively weak.

Accordingly, when the transparent organic light-emitting display device is not driven, the user is capable of seeing a background through the transmissive area TA, namely, an object of a rear side of the transparent display apparatus 200. Meanwhile, when the transparent display apparatus 200 is driven, the user is capable of simultaneously seeing an image of the emissive area EA and the background through the transmissive area TA. Although it has been illustrated in FIG. 2A that an area of the transmissive area TA of a pixel region is greater than that of the emissive area EA, an area ratio of the emissive area EA to the transmissive area TA in the pixel region may be variously set in terms of visibility and transmittance.

Hereinafter, a specific configuration of the transparent display apparatus 200 will be described. A configuration of the transparent display unit 210 is first described, and a configuration of the light control unit 230 is described.

Referring to FIG. 2A, the transparent display unit 210 includes a first substrate 211, an active layer 212, a gate insulating film 213, a gate electrode 214, an interlayer insulating film 215, a source electrode 216b, a drain electrode 216a, an overcoat layer 217, a reflective layer 218, an anode 219, an organic light-emitting layer 220, a cathode 221, and a bank layer 222. The active layer 212, the gate insulating film 213, the gate electrode 214, the interlayer insulating film 215, the source electrode 216b and the drain electrode 216a constitute a thin-film transistor, and the anode 219, the organic light-emitting layer 220 and the cathode 221 constitute an organic light-emitting diode. The organic light-emitting diode includes a sealing part 223, a color filter 224, and a second substrate 225. FIG. 2A illustrates a case where the transparent display unit 210 is a top-emission type organic light-emitting display device.

The specific configuration of the light control unit 230 is described below.

Referring to FIG. 2A, the light control unit 230 includes a third substrate 231, an active layer 232, a gate insulating film 233, a gate electrode 234, an interlayer insulating film 235, a source electrode 236b, a drain electrode 236a, an overcoat layer 237, first electrodes 238, a second electrode 240, protection layers 241 and 242, a fluid 244 including charged particles 245, and partition walls 243.

The light control unit 230 is attached to the transparent display unit 210. Referring to FIG. 2A, the transparent organic light-emitting display device is disposed on the light control unit 230 by using a transparent adhesive or a transparent adhesive layer. In FIG. 2A, although it has been illustrated that the light control unit 230 is disposed under the transparent display unit 210, the light control unit may be formed on the transparent display unit 210. The light control unit 230 and the transparent display unit 210 of the transparent display apparatus 200 may be independently driven, and may selectively control incident light.

Figure 2B:
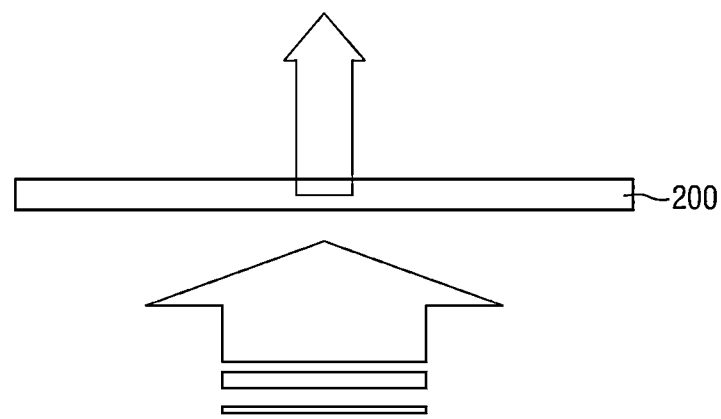
FIGS. 2B and 2C are schematic diagrams illustrating light incident onto the transparent display apparatus according to the embodiment of the present invention.

FIG. 2B is a schematic diagram illustrating light incident onto the transparent display apparatus depicted in FIG. 1 according to the embodiment of the present invention. FIG. 2B illustrates light incident on one light receiving point of the rear side of the transparent display apparatus 200. Although not specifically mentioned, the "light incident or incident light" in the present specification means light incident on one surface of the transparent display apparatus 200. The light incident on the one surface of the transparent display apparatus 200 can be measured by the illuminated sensor included in the area of the transparent display apparatus 200 where light is not emitted or any sensor disposed to measure the incident light.

Referring to FIG. 2B, the light incident on the one surface of the transparent display apparatus 200 may include all kinds of light incident at an angle of 0 degrees to 180 degrees with respect to the substrate as well as light vertically incident onto the transparent display apparatus 200. However, for the sake of convenience in description, although incident light which has quadrature components by being incident onto the transparent display apparatus 200 at a right angle or by being refracted in the transparent display apparatus 200 is described, incident light not having the quadrature components may be described similarly to the incident light that enters at a right angle.

Figure 2C:
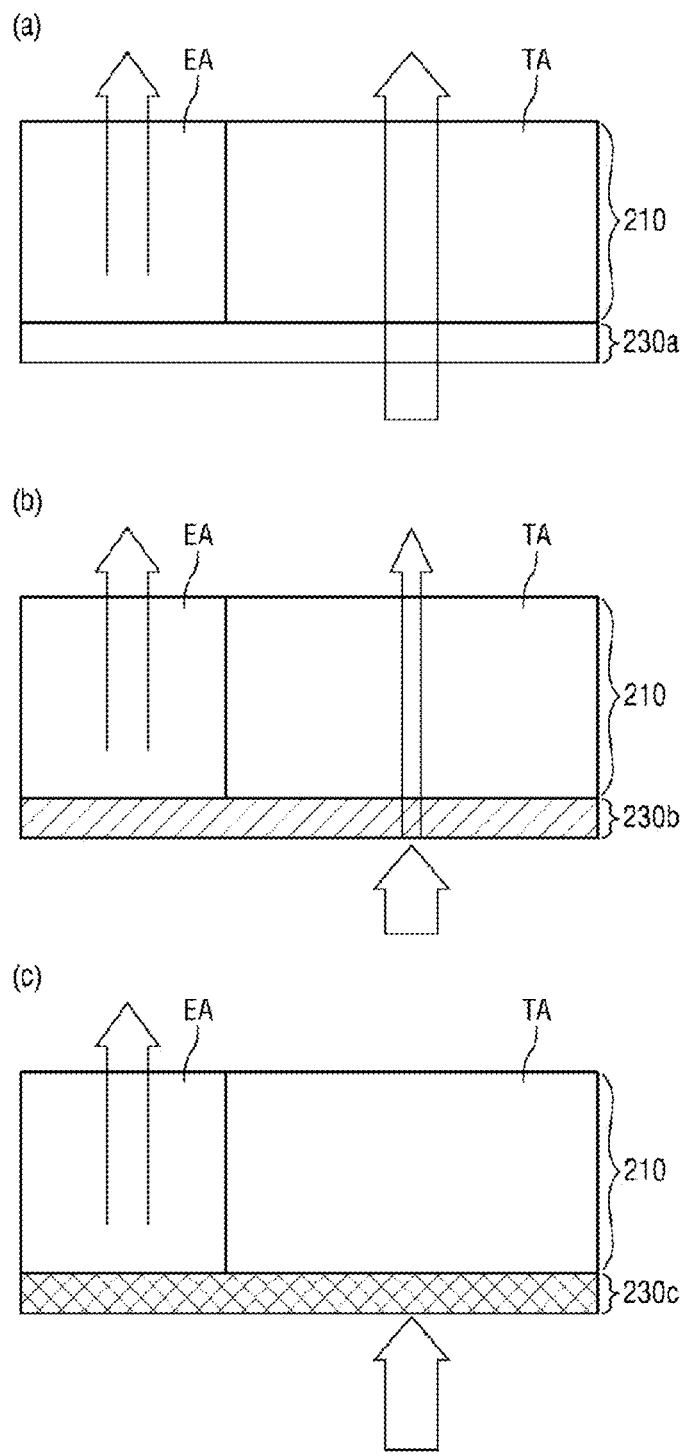

FIG. 2C illustrates the light incident onto the transparent display apparatus 200 depicted in FIG. 1 according to the embodiment of the present invention according to the light controlling of light control units 230a, 230b, and 230c. The transparent display apparatus 200 includes the emissive area and the transmissive area mentioned above. A driving transistor and an organic light-emitting diode are disposed in the emissive area to emit light, and light from the rear side of the transparent display apparatus 200 may enter the transmissive area. Furthermore, the transparent display apparatus 200 include the light control units 230a, 230b and 230c, and the light control units 230a, 230b and 230c have different transmittance values depending on the applying duration of a voltage or intensity of the voltage.

In (a), (b), and (c) of FIG. 2C, it is assumed that light rays having the same intensities are emitted in the emissive part and light rays incident onto the transparent display apparatus 200 are constant. In (a) of FIG. 2C, the light control unit 230a is controlled to allow all the incident light rays to be transmitted. When the light control unit 230a is controlled to allow all the incident light rays to be transmitted, the user sees both light emitted from the emissive part and light incident on the rear side of the transparent display apparatus 200.

In (b) of FIG. 2C, the light control unit 230b is controlled to allow a part of incident light to be transmitted. When the light control unit 230b is controlled to allow a part of incident light to be transmitted, since the user is capable of more clearly seeing emitted light as compared to (a) of FIG. 2C, the visibility of the transparent display apparatus is relatively improved.

In (c) of FIG. 2C, the light control unit 230c is controlled to further decrease the transmittance of the incident light. When the light control unit 230c is controlled to further shield the incident light, since the user is capable of more clearly seeing emitted light as compared to (a) and (b) of FIG. 2C, the visibility of the transparent display apparatus is improved, but it may be difficult to see the object on the rear side of the transparent display apparatus 200.

In the transparent display apparatus 200 according to the embodiment of the present invention, by controlling the transmittance of the light control units 230a, 230b and 230c, it is possible to control the transparent display apparatus 200 so as to enhance the visibility from the point of view of the user of the transparent display apparatus 200.

Figure 3:
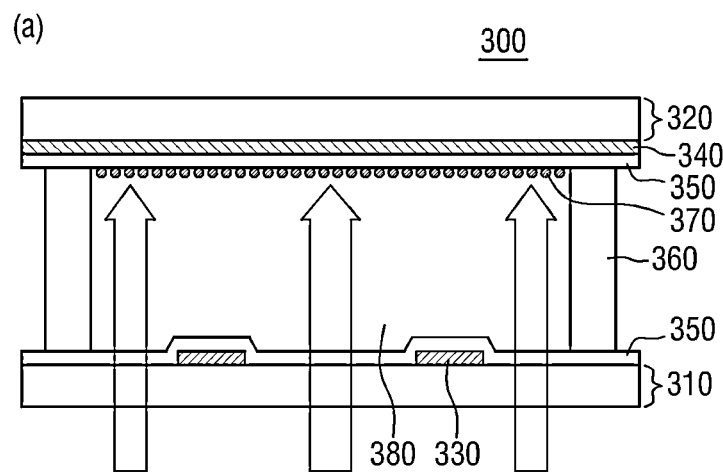
FIG. 3 shows schematic diagrams illustrating a light control unit of the transparent display apparatus according to the embodiment of the present invention.
Figure 3:
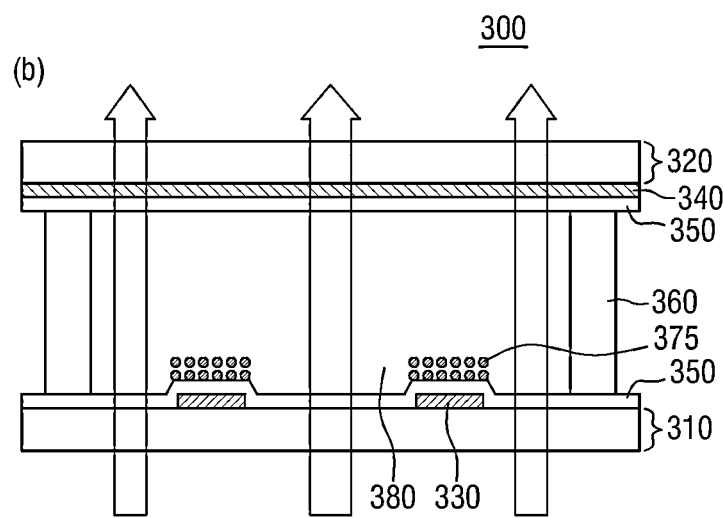

FIG. 3 shows schematic diagrams illustrating a light control unit of the transparent display apparatus depicted in FIG. 1 according to the embodiment of the present invention. In (a) and (b) of FIG. 3, a third substrate 310, a fourth substrate 320, a first electrode 330, a second electrode 340, partition walls 360, a protection layer 350 and a fluid 380 are the same as the third substrate 231, the fourth substrate 239, the first electrode 238, the second electrode 240, the partition walls 243, the protection layers 241 and 242 and the fluid 244 described in FIG. 2A. Thus, the redundant descriptions thereof are not presented.

In (a) of FIG. 3, external light incident onto a light control unit 300 passes through the third substrate 310, reaches black charged particles 370, and is then absorbed by the black charged particles 370. Since the incident light is shielded by an arrangement of the black charged particles 370, such a state of the transparent display apparatus is called a shield state.

In (b) of FIG. 3, external light incident onto the light control unit 300 passes through a light control unit 300 by sequentially passing through the third substrate 310, the second electrode 340, and the fourth substrate 320. Since the incident light is transmitted by an arrangement of black charged particles 375, such a state of the light control unit 300 is called a transmissive state or a transparent state.

Alternatively, only a part of the incident light is transmitted between the black charged particles. Since the transmitted part of the light is transmitted through the transmissive area, the object on the rear side of the transparent display apparatus can be seen at an upper part of the transparent display apparatus. The remaining part of the incident light reaches the black charged particles and is absorbed by the black charged particles. Since the incident light is transmitted or shielded by the spread of the black charged particles 370 and 375, such a state of the light control unit 300 is called a translucent state.

In the translucent state in which only a part of the incident light is transmitted, the transmittance is variably controlled depending on an applying time or applying magnitude of a voltage applied to the first electrode 330 or the second electrode 340 of the light control unit 300.

Figure 4:
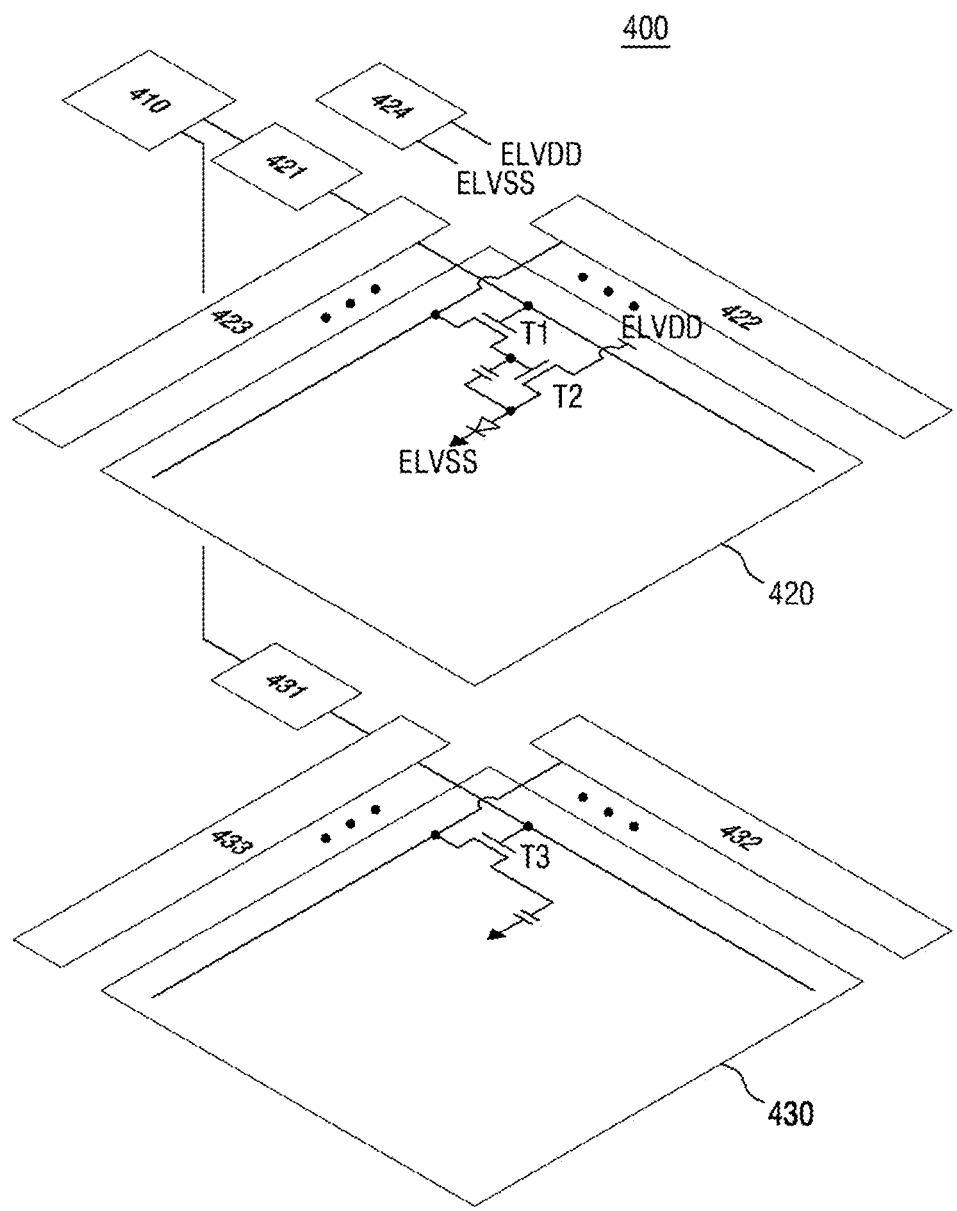
FIG. 4 is a schematic diagram of a transparent display apparatus according to an embodiment of the present invention.

FIG. 4 is a schematic diagram of a transparent display apparatus depicted in FIG. 1 according to an embodiment of the present invention. A transparent display apparatus 400 includes a processing unit 410, a transparent-display-unit timing controller 421, a transparent-display-unit panel 420, a transparent-display-unit data driving unit 422, a transparent-display-unit scan driving unit 423, a light-control-unit timing controller 431, a light-control-unit panel 430, a light-control-unit data driving unit 432, and a light-control-unit scan driving unit 433.

The timing controllers 421 and 431 may be formed on one integrated circuit or may be patterned on the panels, and the timing controllers 421 and 431 and the data driving units 422 and 432 may be provided in various forms such as COG (Chip on Glass), COF (Chip on Film), PCB, and FPCB (Flexible Circuit Board).

The processing unit 410 provides video data to the transparent-display-unit timing controller 421 and light control data to the light-control-unit timing controller 431. The light control data may be data for selectively controlling the transmittance of incident light.

The processing unit 410 may generate a synchronization signal and provide the generated synchronization signal to the transparent-display-unit timing controller 421 and the light-control-unit timing controller 431 so as to allow the transparent display unit and the light control unit to be time-synchronized. The synchronization signal may be generated to be synchronized to a panel having a slow response speed of the transparent display unit and the light control unit.

The transparent display unit includes the transparent-display-unit timing controller 421, the transparent-display-unit panel 420, the transparent-display-unit data driving unit 422, the transparent-display-unit scan driving unit 423, and a power supply unit 424.

The transparent-display-unit timing controller 421 may be referred to as a transparent-display-unit driving unit, and the transparent-display-unit driving unit generates a scan control signal on the basis of the image to control the transparent-display-unit scan driving unit 423, and generates a data signal to control the transparent-display-unit data driving unit 422.

The transparent-display-unit data driving unit 422 receives the data signal from the transparent-display-unit timing controller 421. The transparent-display-unit data driving unit 422 converts the data signal into the corresponding gamma voltage, and determines the amount of current flowing in the anode and the cathode of the organic light-emitting diode to control a degree of emitting of the corresponding pixel.

The transparent-display-unit scan driving unit 423 is operated such that scan lines are driven and the data signal is input to pixels corresponding to the scan lines. The transparent-display-unit scan driving unit 423 may provide one scan line signal or a plurality of scan line signals for selecting the scan line or a plurality of scan lines to the transparent-display-unit panel 420.

The power supply unit 424 supplies various voltages required in the transparent-display-unit data driving unit 422, the transparent-display-unit scan driving unit 423 and the anode and the cathode of the transparent-display-unit panel 420. The power supply unit 424 supplies ELVDD, ELVSS, VDD, and VSS. The transparent-display-unit panel 420 includes a plurality of scan lines, a plurality of data lines, and a plurality of transparent-display-unit pixels.

In order to emit the organic light-emitting layer by video information of the input data signal, a switching thin-film transistor T1 and a driving thin-film transistor T2 are used.

Driving of the light control unit in the transparent display apparatus 400 according to the embodiment of the present invention is described. The light control unit may be configured and be driven in a passive matrix. The light control unit may be driven in an active matrix. The light-control-unit timing controller 431 receives the light control data from the processing unit 410 as mentioned above. The light control data is data for controlling the transmittance of the transparent display apparatus 400. The light control data is determined by the light-control-unit timing controller 431 or the processing unit 410 of the transparent display apparatus 400.

The light-control-unit scan driving unit 433 is operated such that the scan lines are driven and the data signal is input to the pixels corresponding to the scan lines. The light-control-unit data driving unit 432 converts the data signal into the corresponding voltage, and supplies the voltage and pulse to the light control unit to control the spread of the black charged particles. In other words, the transparent display apparatus 400 adjusts the voltage or pulse applied to the light control unit by using the light control data, so that the transmittance of the light control unit can be adjusted.

The power supply unit supplies the voltages required in the light-control-unit data driving unit 432 and the light-control-unit scan driving unit 433.

When the scan control signal is applied from a scan wiring, a switching thin-film transistor T3 transmits the light control data signal from the data line to the electrode of the light control unit to control the voltage applied to the electrode, and the movement of the black charged particles distributed in the fluid is controlled by the applied voltage.

Figure 5:
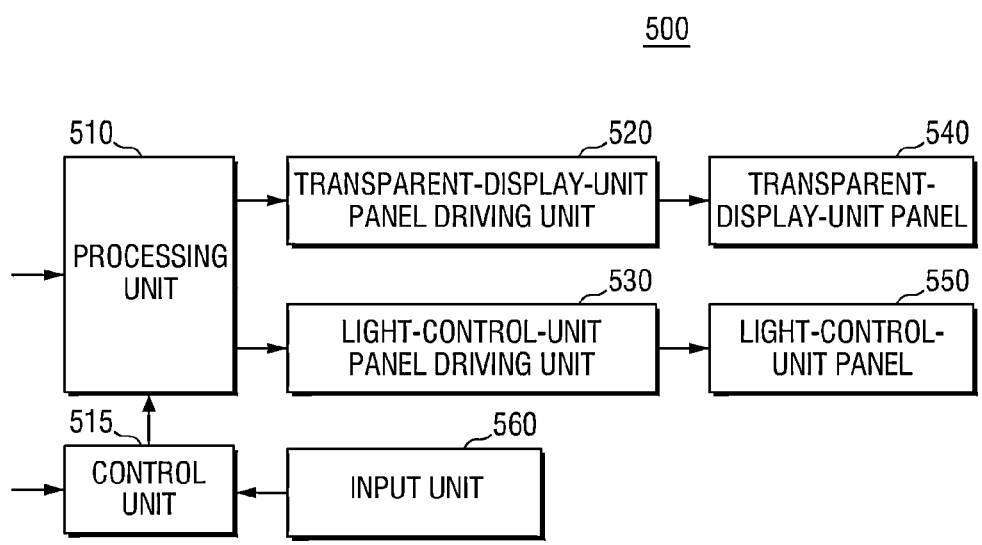
FIG. 5 is a block diagram of a transparent display apparatus according to an embodiment of the present invention.

FIG. 5 is a block diagram of a transparent display apparatus depicted in FIG. 1 according to an embodiment of the present invention. A transparent display apparatus 500 includes a processing unit 510, a control unit 515, a transparent display unit, and a light control unit. The transparent display unit includes a transparent-display-unit panel 540 and a transparent-display-unit panel driving unit 520, and the light control unit includes a light-control-unit panel 550 and a light-control-unit panel driving unit 530. The transparent-display-unit panel 540 and the light-control-unit panel 550 include a plurality of pixels.

The control unit 515 controls an operation of a system of the transparent display apparatus 500. The control unit 515 may operate the system in response to a command of the user, and operates the system according to a preset operation. The control unit 515 controls, for example, the processing unit 510 to decrease the transmittance on the basis of the light characteristics from the optical sensor so as to improve the visibility of the image displayed on the transparent display apparatus 500 and to operate various modes of the transparent display apparatus 500.

The control unit 515 may be integrated with the processing unit 510. Further, the control unit 515 of the transparent display apparatus 500 includes the system. The system includes an OS (Operating System). The OS further includes various modes for providing effects of the present invention to the user. The modes are selected by the user when necessary, and, especially, a third mode is actively adapted to the ambient environment to be selected as an optimum mode.

A first mode sets the light control unit to a transmissive state. The first mode maximizes a transparent effect. However, a problem about the visibility of an external environment is not solved.

A second mode sets the light control unit to a shield state. The second mode maximizes a shield effect. The visibility is enhanced as much as possible in the second mode. However, there is a problem that since the transmissive area of the entire screen is shielded, a transparent display effect is not exhibited.

The third mode is a mode for extracting an object of the input video and adjusting the transmittance of the area of the light control unit corresponding to the object displayed on the transparent display unit. The transparent display apparatus 500 in the third mode minimizes a decrease in visibility with a change in an external illuminance environment and the external environment. In the third mode, the visibility of the input video is maintained while maintaining the transparent effect.

A fourth mode is a light control mode, and the fourth mode displays the image on the light control unit instead of the transparent display unit. The fourth mode is specialized under the outdoor environment and is effective when the external light is considerably bright. In the fourth mode, the power supply of the organic light-emitting device is blocked to drive the organic light-emitting device at low power. The image is realized by controlling the shielding of the light control unit. The fourth mode may be selected by the user in the environment of very high illuminance or may be operated by setting a fourth mode entering reference illuminance.

The operations of the control unit 515 are selected through an input unit 560 on the system. For example, the transparent display apparatus 500 includes the input unit 560, and the plurality of modes may be sequentially changed whenever input signals are input through the input unit 560. Such a physical input unit 560 can be effectively used when the visibility of the transparent display apparatus 500 is rapidly decreased. When the visibility is rapidly decreased, since it is difficult for the user to see menus displayed on the transparent display unit, it may be difficult to select a necessary mode.

Figure 6:
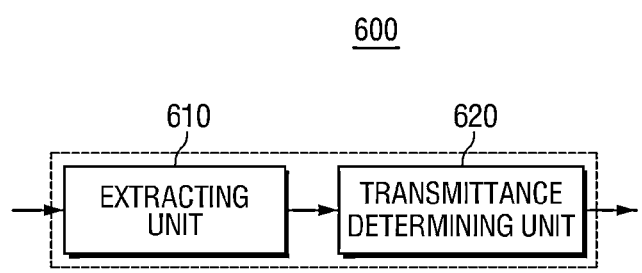
FIG. 6 is a block diagram of a transmittance control device according to an embodiment of the present invention.

FIG. 6 is a block diagram of a transmittance control device according to an embodiment of the present invention. Referring to FIG. 6, a transmittance control device 600 includes an extracting unit 610 and a transmittance determining unit 620.

The transmittance control device 600 means a data processing unit that is included in or connected to the light control unit, analyzes an image displayed on the transparent display unit to extract an object, and determines transmittance of an area corresponding to the extracted object. Transmittance control device 600 thus adjusts the portion of the light passing through the transparent display unit by adjusting transmittance of the light control unit.

The extracting unit 610 separates the object from the image by analyzing the input video to identify the object. The extracting unit 610 separates the object from the image by using various algorithms. The object extracted by the extracting unit 610 may be an object having saliency in the image. For example, the object extracted by the extracting unit 610 may be an object or a person which is a central figure in the image. When one object is extracted, for example, when one object exists in the image, it is determined that the image includes the object and the background, and the object and the background may be respectively extracted as one object.

The extracting unit 610 separates the object from the image through video classification. The image classification means a process in which a given video is divided into a plurality of areas having similar characteristics or uniformity. In the image classification process, feature elements such as contrast, a color component, a boundary, texture, movement, depth information, a degree of importance, and template matching are used as a criterion of uniformity. Examples of a classification algorithm include a threshold-based algorithm, a cluster-based algorithm, a template matching algorithm, and an edge-based algorithm.

The template matching algorithm classifies or extracts similar objects by measuring a similarity between a template and the image in the entire video. The template is an object having high appearance frequency in the image, such as a person's face, an icon, or a character. The extracting unit 610 loads the image and the template from the template matching algorithm and creates a correlation coefficient map between parts of the image and the template. The extracting unit 610 may extract the object corresponding to the template by obtaining a maximum correlation coefficient in the correlation coefficient map. The template matching algorithm has an advantage in extracting a standardized object such as an icon, a program window, a person's face, or a character.

The extracting unit 610 can more precisely recognize a contour of the object by applying another extraction algorithm on the basis of the object extracted using the template matching algorithm. Alternatively, the extracting unit may extract the object by using another algorithm and more clearly recognize the contour of the object by using the template matching algorithm.

The object can be separated from the image by using a boundary or an edge. The boundary in the image includes a lot of information on the image and is an element representing features of the image. The boundary in the image may be used to classify and separate the object as well as providing contour information of objects constituting the image.

The boundary includes high signal variation in terms of video processing. Accordingly, the extracting unit 610 may measure signal variation in each pixel of the image and determine whether or not the pixel is a boundary pixel on the basis of the measured signal variation. Moreover, the boundary detection may be performed by calculating a slope of the signal variation in the pixel and comparing a value of the slope with a threshold value.

The threshold-based algorithm is an algorithm that sets a plurality of threshold values and divides the image for each of contrast value ranges divided by the threshold values. Here, the threshold value is called a bi-level threshold value when one threshold value is used, and the threshold value is called a multi-level threshold value when several threshold values are used. The bi-level threshold value may be used when an image including two areas such as a foreground and a background that have different brightness levels is divided into the areas. In addition, the extracting unit 610 of the transparent display apparatus according to the embodiment of the present invention may be configured to extract a text, an icon, and a program active window included in the image. The extracting unit 610 may perform various filtering on brightness image information of the image to remove the background, and then obtain the boundary to extract the text, the icon, or the program active window. The text, the icon, or the program active window may be generally elements that include important information in the image and that can be selected by an interactive device.

Further, the extracting unit 610 of the transparent display apparatus according to the embodiment of the present invention may generate a saliency map in order to separate the object from the image and separate the object from the background on the basis of the saliency map.

The saliency map may be called a feature map, and represents concentration levels of attention generated in a salient area or a non-salient area as a map. A visual system of a viewer extracts only necessary information to efficiently process the extracted information instead of processing all images seen by eyes. The salient area may be a visual selection area of a part of the input video which is the most interest. The salient area may be determined by visual attention characteristics. The determination of the salient area by visual attention characteristics may be performed by selecting only significant features in the image.

The salient area may be distinguished by salient factors represented by a spatial distribution of information within the image. That is, after various features of input images are extracted, the extracted features are combined to extract a feature indicating a degree of importance of several images among the images, and the salient area may be selected based on the extracted feature.

The method of extracting the salient area and setting the degree of importance thereof may be variously performed, and the extracting unit 610 of the transparent display apparatus according to the embodiment of the present invention may obtain the salient map by analyzing features of the image such as color and shape and applying an importance filter to analyze the degree of importance corresponding to the features. The extracting unit 610 may extract the object on the basis of the salient map.

Further, the object may be extracted by sending positional information on the displayed object to the extracting unit 610 of the transparent display apparatus. For example, when x and y coordinates of a rectangular program window displayed on the transparent display apparatus are sent to the extracting unit 610, the extracting unit 610 may extract the display object. Alternatively, the extracting unit 610 may request positional information and contour information of the object to a system that provides the displayed video, and the system may provide information on the object to the extracting unit 610. When the system provides the information on the object to the extracting unit 610, the system that provides the image may be, for example, a system that provides a structured video.

The transmittance determining unit 620 determines the transmittance of the area corresponding to the separated object. As stated above, the transmittance is controlled by the light control unit of the transparent display apparatus by using a light-control-unit data signal. That is, the light-control-unit data signal is generated based on the determined transmittance.

The transmittance determining unit 620 may be configured to decrease the transmittance of the area corresponding to the object in order to improve the visibility of the extracted object. The transparent display unit may represent red, green, and blue through pixels, and may represent natural colors by combining these three colors. In order for the transparent display unit to represent black, red, green, and blue are not allowed to be emitted, and interference caused by the transmissive area and light incident onto the transmissive area exists in the transparent display unit. Accordingly, when the transmittance is decreased, interference of light incident onto the transmissive area can be reduced, so that it is possible to improve the visibility of the image. The transmittance control device 600 of the present invention is configured to decrease the transmittance of the area corresponding to the extracted object to secure the visibility of the object.

When the extracted object moves within the image, since a portion corresponding to the object is also moved, the transmittance determining unit 620 may determine the transmittance so as to the portion corresponding to the object to be moved in synchronization with time.

Furthermore, when a plurality of objects is displayed, the transmittance determining unit 620 determines the transmittance so as to allow the plurality of objects to have different transmittance values. When one object is displayed, it is determined that the image includes the object and the background, and the object and the background are respectively extracted as one object. The object and the background have different transmittance values, and the transmittance of the area corresponding to the object may be lower than the transmittance of the area corresponding to the background.

Moreover, when a plurality of objects is overlapped, the transmittance determining unit 620 determines the transmittance so as to allow the plurality of objects to have different transmittance values. For example, by allowing the transmittance of one object to be lower than the transmittance of the other one object, it is possible to relatively improve the visibility of the one object.

In addition, the transmittance determining unit 620 determines the transmittance of the area corresponding to the object on the basis of video characteristics of the object. For example, the transmittance determining unit 620 may determine the transmittance so as to allow the plurality of objects to have different transmittance values depending on luminance values of the plurality of objects. It is possible to further improve the visibility by adjusting the transmittance of the object having a low luminance value rather than adjusting the transmittance of the object having a high luminance value.

In addition, the transmittance determining unit 620 determines the transmittance of the area corresponding to the object depending on the kind of the object. For example, the transmittance determining unit 620 may determine the transmittance so as to allow a text and a moving image to have different transmittance values. The transmittance determining unit 620 may determine the transmittance so as to allow an object having a relatively larger size to have transmittance of an intermediate level and may determine the transmittance so as to allow an object having a relatively smaller size to have transmittance of a low level. The object considered as being important, such as a character extracted by the template matching, may have lower transmittance or the lowest transmittance. The transmittance of the text may be determined to be different depending on a color of the text. For example, the transmittance determining unit 620 may determine the transmittance so that white text and black text have different transmittance values. In addition, the transmittance of the white text may be decreased in an area wider than an area of the text by extending a boundary of the text.

The transmittance determining unit 620 may determine the transmittance values of the areas corresponding to the objects and generate a light-control-unit control signal including the determined transmittance. The transmittance control device 600 may include a sending unit that sends the light-control-unit control signal to the transparent display apparatus or the light control unit of the transparent display apparatus so as to control the determined transmittance values of the plurality of areas. The transmittance control device 600 may be included in the processing unit 510.

Figure 7:
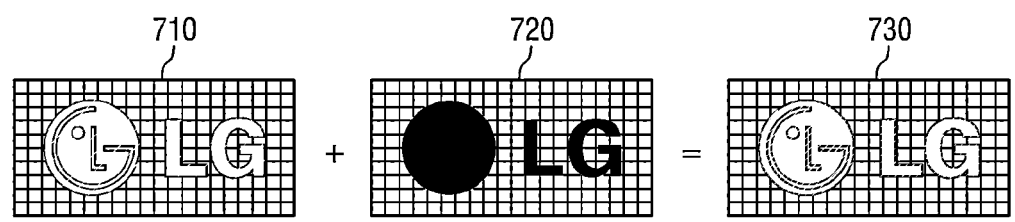
FIGS. 7 to 9 are schematic diagrams showing images by the transparent display apparatus according to the embodiment of the present invention.
Figure 8:
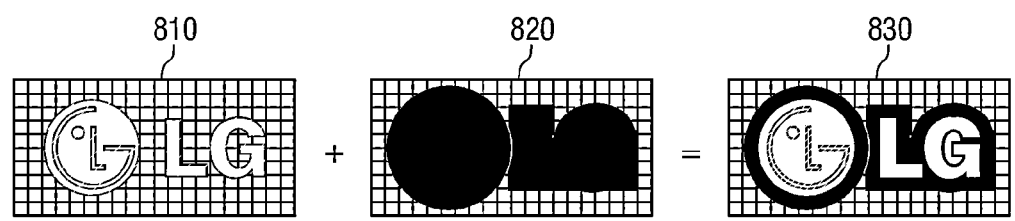
Figure 9:
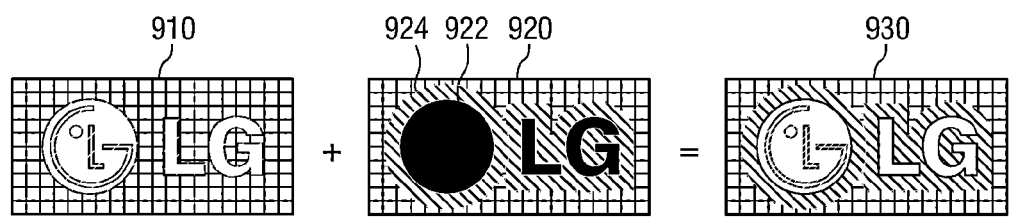

FIGS. 7 to 9 are schematic diagrams showing images by the transparent display apparatus according to the embodiment of the present invention. In FIGS. 7 to 9, although it has been shown that an object 710 is a character and an icon, the object 710 is not limited thereto.

FIG. 7 illustrates the object 710 displayed by the transparent display unit of the transparent display apparatus according to the embodiment of the present invention, an area 720 corresponding to the object, which is controlled by the light control unit, and an object 730 seen by the user. In FIGS. 7 to 9, a lattice shape means that a plurality of light control units and transparent display units include pixels. However, although an actual size of a pixel of a product to which the present invention is applied is considerably small, the pixel is arbitrarily illustrated in a large size in order to describe the concept.

In the object 710 displayed by the transparent display unit, an image emitted in the emissive area of the transparent display unit and interference of light incident on the transmissive area exist. Accordingly, the visibility of the object 710 may be low, and it is difficult to recognize luminance differences between pixels within the object 710. Referring to FIG. 7, the area 720 corresponding to the object, which is controlled by the light control unit, is substantially the same size as an area of the object 710 displayed by the transparent display unit. The area 720 corresponding to the object is displayed so as to allow incident light to be shielded by the light control unit. Accordingly, the area 720 corresponding to the object is displayed in a non-transparent state or in almost black by shielding incident light.

The object 730 seen by the user is a combination of the object 710 displayed by the transparent display unit and the area 720 corresponding to the object, which is controlled by the light control unit. Since the area 720 corresponding to the object shields light incident from the rear side, the user can recognize only light for the object 710 emitted from the emissive area, and the interference by incident light is reduced to be able to improve the visibility of the object 710.

FIG. 8 illustrates an object 810 displayed by the transparent display unit of the transparent display apparatus according to the embodiment of the present invention, an area 820 corresponding to the object, which is controlled by the light control unit, and an object 830 seen by the user. The object 810 displayed by the transparent display unit is the same as the object 710 of FIG. 7, and thus the redundant description thereof will not be presented.

Referring to FIG. 8, the area 820 corresponding to the object includes an area defined by a boundary of the object 810 and a surrounding area of the object 810. The surrounding area of the object 810 is an area formed by extending from the boundary of the object 810 to the outside by a pre-determined number of pixels. In FIG. 8, the surrounding area of the object 810 is an area formed by extending to the outside from the boundary of the object 810 by 5 pixels. The area 820 corresponding to the object is displayed in almost black by shielding incident light by the light control unit.

The object 830 seen by the user is a combination of the object 810 displayed by the transparent display unit and the area 820 corresponding to the object, which is controlled by the light control unit. Referring FIG. 8, since the area 820 corresponding to the object is wider than an area of the object 810 displayed on the transparent display unit, the surrounding area is simultaneously seen with the object 810. The surrounding area displayed simultaneously with the object 810 can allow the boundary of the object 810 to be clearer and allow the object to be clearer in the image.

FIG. 9 illustrates an object 910 displayed by the transparent display unit of the transparent display apparatus according to the embodiment of the present invention, an area 920 corresponding to the object, which is controlled by the light control unit, and an object 930 seen by the user. The object 910 displayed by the transparent display unit is the same as the object 710 of FIG. 7, and thus the redundant description thereof will not be presented.

The area 920 corresponding to the object includes an area 922 defined by a boundary of the object and a surrounding area 924 of the object. The area 922 defined by the boundary of the object and the surrounding area 924 of the object have different transmittance values. The transmittance of the surrounding area 924 of the object may be gradually increased or decreased as it is farther from the area 922 defined by the boundary of the object. In FIG. 9, the surrounding area 924 of the object has the transmittance higher than that of the area 922 defined by the boundary of the object. When both the surrounding area 924 of the object and the area 922 defined by the boundary of the object have low transmittance values, since the surrounding area 924 of the object is displayed to be excessively cleared as a boundary of the object 910, the user can unnaturally recognize the object. Accordingly, the surrounding area 924 of the object has the transmittance higher than that of the area 922 defined by the boundary of the object. Further, the transmittance of the surrounding area 924 of the object may be determined depending on a luminance value of a surrounding video of the object 910.

The object 930 seen by the user is a combination of the object 910 displayed by the transparent display unit and the area 920 corresponding to the object, which is controlled by the light control unit. Referring FIG. 9, since the area 920 corresponding to the object is wider than an area of the object 910 displayed on the transparent display unit, the surrounding area 924 can be simultaneously seen with the object 910. The surrounding area 924 displayed simultaneously with the object 910 can allow the boundary of the object 910 to be clear and allow the object to be naturally displayed in the image.

Figure 10:
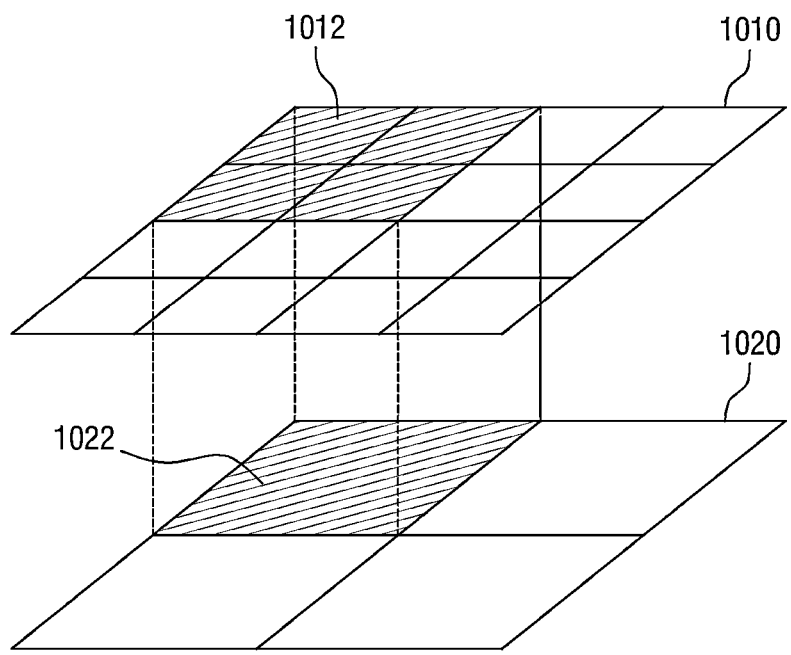
FIG. 10 is a conceptual diagram for describing a pixel of the transparent display apparatus according to the embodiment of the present invention.

FIG. 10 is a conceptual diagram for describing pixels of the transparent display apparatus according to the embodiment of the present invention. The transparent display apparatus includes a transparent display unit 1010 and a light control unit 1020, and the transparent display unit 1010 and the light control unit 1020 includes a plurality of transparent-display-unit pixels and a plurality of light-control-unit pixels. In the transparent display apparatus according to the embodiment of the present invention, the transparent-display-unit pixels and the light-control-unit pixels may be in one-to-one correspondence with each other, or one light-control-unit pixel may correspond to the plurality of transparent-display-unit pixels as shown in FIG. 10. That is, the transparent display unit 1010 and the light control unit 1020 may be different in the number of pixels and size, and the number of transparent-display-unit pixels may be greater than the number of light-control-unit pixels as shown in FIG. 10.

The plurality of transparent-display-unit pixels includes one set of transparent-display-unit pixels 1012. Referring to FIG. 10, the one set of transparent-display-unit pixels 1012 corresponds to one light-control-unit pixel 1022. In FIG. 10, the one set of transparent-display-unit pixels 1012 includes four 2×2 transparent-display-unit pixels 1012, but the one set of transparent-display-unit pixels 1012 may be N×M (for example, 4×4, 16×16, or 2×4) transparent-display-unit pixels 1012.

When the one set of transparent-display-unit pixels 1012 corresponds to one light-control-unit pixel 1022, the boundary of the object may include only a part of the one set of transparent-display-unit pixels 1012. In the transparent display apparatus according to the embodiment of the present invention, when even one pixel of the one set of transparent-display-unit pixels 1012 is included in the boundary of the object, the one set of transparent-display-unit pixels 1012 are all recognized as a part of the object, so that the transmittance of the corresponding area can be controlled.

Figure 11:
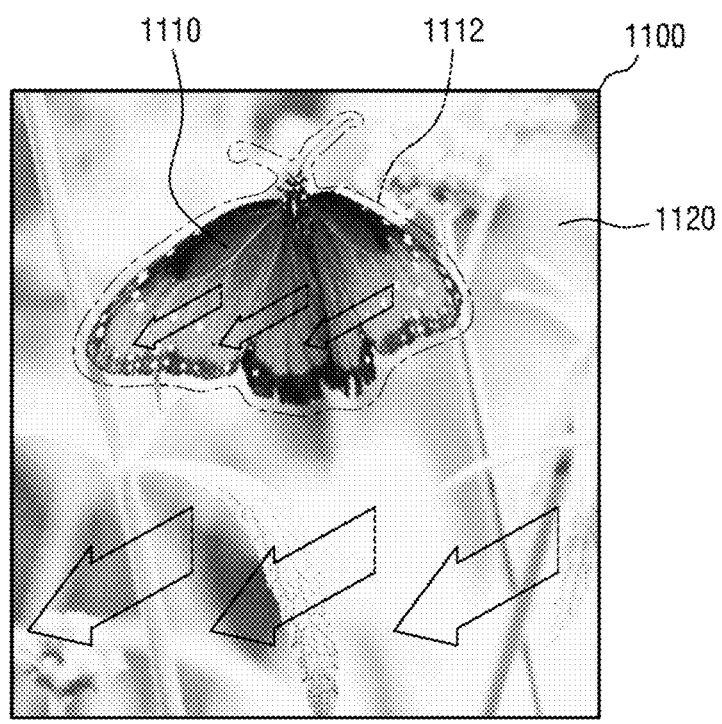
FIG. 11 is a schematic diagram showing an image by a transparent display apparatus according to various embodiments of the present invention.

FIG. 11 is a schematic diagram showing an image of a transparent display apparatus according to various embodiments of the present invention. Referring to FIG. 11, a displayed video 1100 includes an object 1110, an area 1112 corresponding to the object, and a background 1120. The object 1110 may be extracted by one of the object extraction algorithms described in FIG. 6. The transmittance of the extracted object is controlled by the area 1112 corresponding to the object, and the object is displayed to have low transmittance. The area corresponding to the background 1120 is displayed so as to have transmittance higher than that of the area 1112 corresponding to the object.

FIG. 11 illustrates light incident on the rear side of the transparent display apparatus. Since the amount of light transmitted through the object 1110 is relatively smaller than the amount of light incident on the background 1120, there is less interference or noise in the object 1110. The object 1110 is superior in visibility to the background 1120 having much interference or noise.

Figure 12:
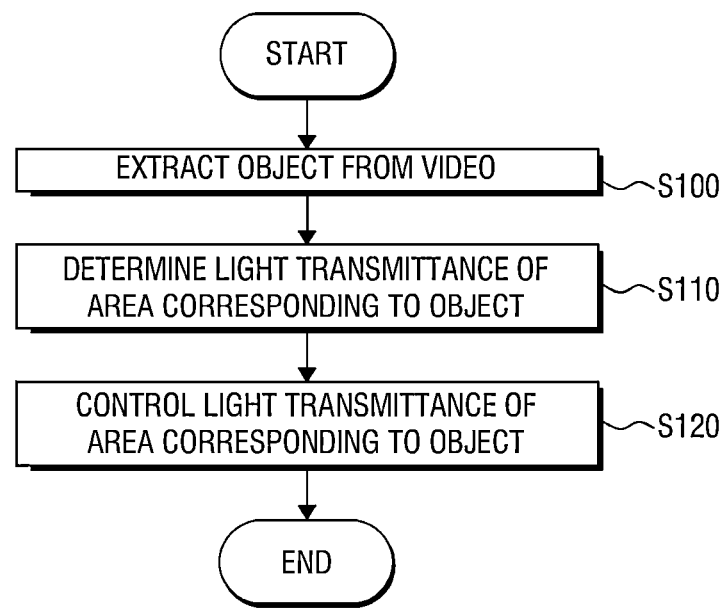
FIG. 12 is a flowchart of a method for controlling a transparent display apparatus according to an embodiment of the present invention.

FIG. 12 is a flowchart of a method for controlling a transparent display apparatus according to an embodiment of the present invention. For the sake of convenience in description, the description will be made with reference to the processing unit, the transparent display unit and the light control unit of the transparent display apparatus. Further, all steps may be independently performed, but may be described as one process in the following description for the sake of convenience in description.

The processing unit identifies an object from an image in order to extract the object (S100). The processing unit separates the object from the image by analyzing the input video and identifies the object by using various algorithms. The identified object may be an object or a person that is a central figure in the image or may be a text or an icon having a degree of importance in the image.

The processing unit determines transmittance of an area corresponding to the object (S110). The transmittance of the area corresponding to the object so as to improve the visibility of the recognized object may be decreased. Furthermore, when a plurality of objects is recognized, the transmittance may be determined so as to allow the plurality of objects to have different transmittance values. The object and the background may also have different transmittance values, and the transmittance of the area corresponding to the object may be lower than the transmittance of the area corresponding to the background.

The transparent display unit displays the object, and the light control unit disposed on one surface of the transparent display unit controls the transmittance of the area corresponding to the object (S120), which thereby controls the portion of the external light passing through the transparent display unit. Since light incident on the rear side is shielded by the area corresponding to the object, the user can easily recognize light of the object emitted from the emissive area, and interference by external light is decreased to be able to improve the visibility of the object.

Figure 13:
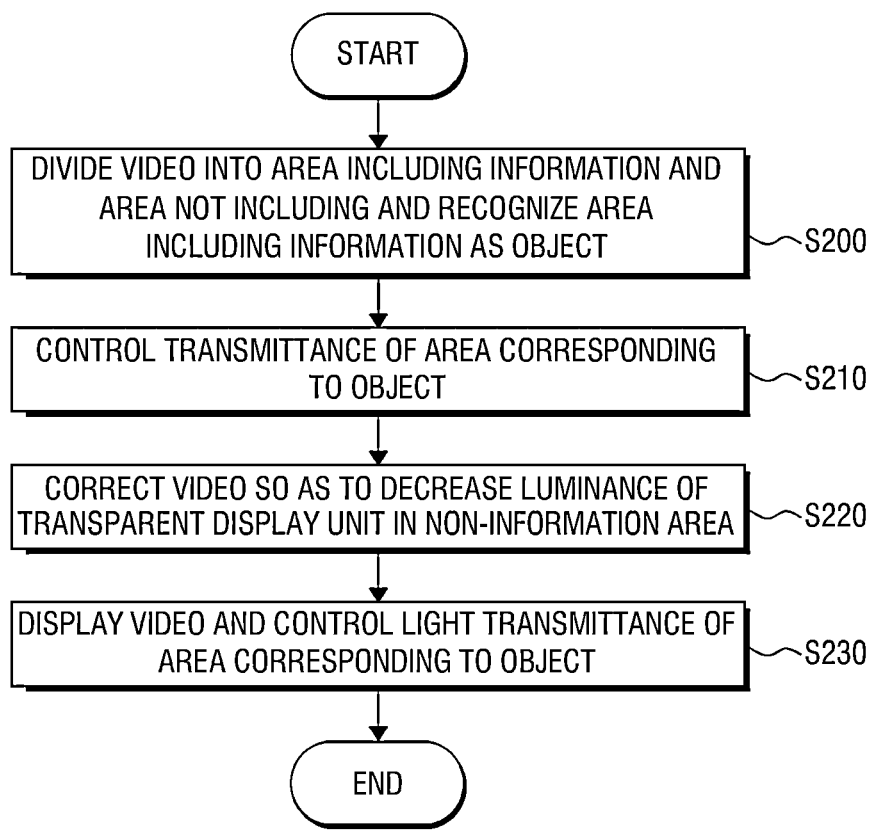
FIG. 13 is a flowchart of a method for controlling a transparent display apparatus according to various embodiments of the present invention.

FIG. 13 is a flowchart of a method for controlling a transparent display apparatus according to various embodiments of the present invention. For the sake of convenience in description, the description will be made with reference to the processing unit, the transparent display unit and the light control unit of the transparent display apparatus. Further, all steps may be independently performed, but may be described as one process in the following description for the sake of convenience in description.

An ideal transparent display apparatus is an apparatus in which an image input to a panel is clearly seen and an ambient environment transparently seen through a rear side due to transparency of the transparent display apparatus is also clearly seen.

Pixels of the transparent display apparatus include a transmissive part and an emissive part. When the amount of light of one part of the transmissive part and the emissive part is relatively larger than that of the other, the visibility of the image of the adjacent transmissive part or emissive part or the visibility of the ambient environment may be degraded.

Accordingly, in order to maintain optimum visibility of the input video of the transparent display apparatus, it is required that the amount of light transmitted through the transmissive part is set to be relatively lower than the amount of light of the adjacent emissive part.

In contrast, in order to maintain optimum visibility of the ambient environment that is transparently seen, it is required that the amount of light emitted from the emissive part is set to be relatively lower than the amount of light transmitted through the adjacent transmissive part.

That is, brightness of the transmissive part and brightness of the emissive part have a conflict relation in terms of visibility. Due to such characteristics, it is difficult for the transparent display apparatus to simultaneously satisfy the visibility of the transmissive part and the visibility of the emissive part.

Hereinafter, there will be described an embodiment in which the visibility of the image and the visibility of the ambient environment that is transparently seen are simultaneously maintained by dividing the input video into an area including information and an area not including information and controlling the areas to have different transmittance values by the light control unit.

Referring to FIG. 13, the processing unit divides the input video into the area including information and the area not including information and recognizes the area including information as an object (S200). The image includes information and non-information. The information and the non-information meant in the embodiment are determined depending on the presence or absence of information to be sent to the user. For example, when working on a document is performed through the display unit, an image, a character, an image, a certain shape, and a figure in the document include information, but it may be determined that a white background in the document clearly shows the character and does not include important information. The background may have design elements such as brightness of various colors and various textures, but it may be determined in the embodiment that the background does not include important information. That is, the important information is elements that are likely to cause a problem in sending information when information does not exist, such as writing including a specific content, an icon such as a button for performing a specific function, and an image having specific information.

For example, in a document in which a black character is written on a white background, it is determined that the black character includes information and the white background does not include any special information. In contrast, in a document in which a white character is written on a black background, it is determined that the white character includes information and the black background does not include any special information. The processing unit recognizes the area divided as the area including information as the object. For example, in the document in which the black character is written on the white background, an area of the black character is recognized as an object. Furthermore, the area including information, which is recognized as the object, may include a character, an icon, an image, a video, a program active window of the input video.

Subsequently, the processing unit controls the transmittance of the area corresponding to the object (S210). The processing unit sets transmittance values of a non-information area serving as the area not including information and an information area serving as the area including information, or the recognized object to be different from each other. The processing unit sets the transmittance of the information area to be decreased. The processing unit sets the transmittance of the non-information area not including a character to be increased. By increasing the transmittance of the non-information area, it is possible to secure the visibility of the ambient environment in the non-information area.

Meanwhile, when the document in which the black character is written on the white background is displayed on the transparent display unit of the embodiment, most pixels of the area not including a character emits white light to display the white background, and the visibility of the ambient environment that is seen through the adjacent transmissive part is decreased by the white light. In order to maintain the visibility of the ambient environment by the white light, the processing unit can additionally correct the image.

The processing unit corrects the image so as to decrease the luminance of the transparent display unit in the non-information area (S220). For example, by distinguishing a background area that emits the white light and modulating data of the corresponding area, it is possible to decrease or completely suppress the emission of the white light. When the luminance of the transparent display unit is lowered in the non-information area, since the non-information area becomes dark, the ambient environment can be clearly seen and power consumption can be reduced. Accordingly, it is possible to maximize transparency and openness of the transparent display apparatus.

That is, the non-information area is an area that can extend a transparent area by performing image processing on the image and allowing the transmissive part to be more clearly seen since important information is not included.

The transparent display unit displays the object, and the light control unit disposed on one surface of the transparent display unit controls the transmittance of the area corresponding to the object (S230). Since light incident from the rear side is shielded by the area corresponding to the object, which includes information, the user can easily recognize light of the object emitted from the emissive area, and interference by external light is decreased to be able to improve the visibility of the object. In addition, in the method for controlling a transparent display apparatus according to the embodiment of FIG. 13, it is possible to maintain the visibility of the image and the visibility of the background that is transparently seen through the transmissive part by dividing the image into the non-information area and the information is a conceptual diagram showing an information area in the method for controlling a transparent display apparatus area.

Figure 14:
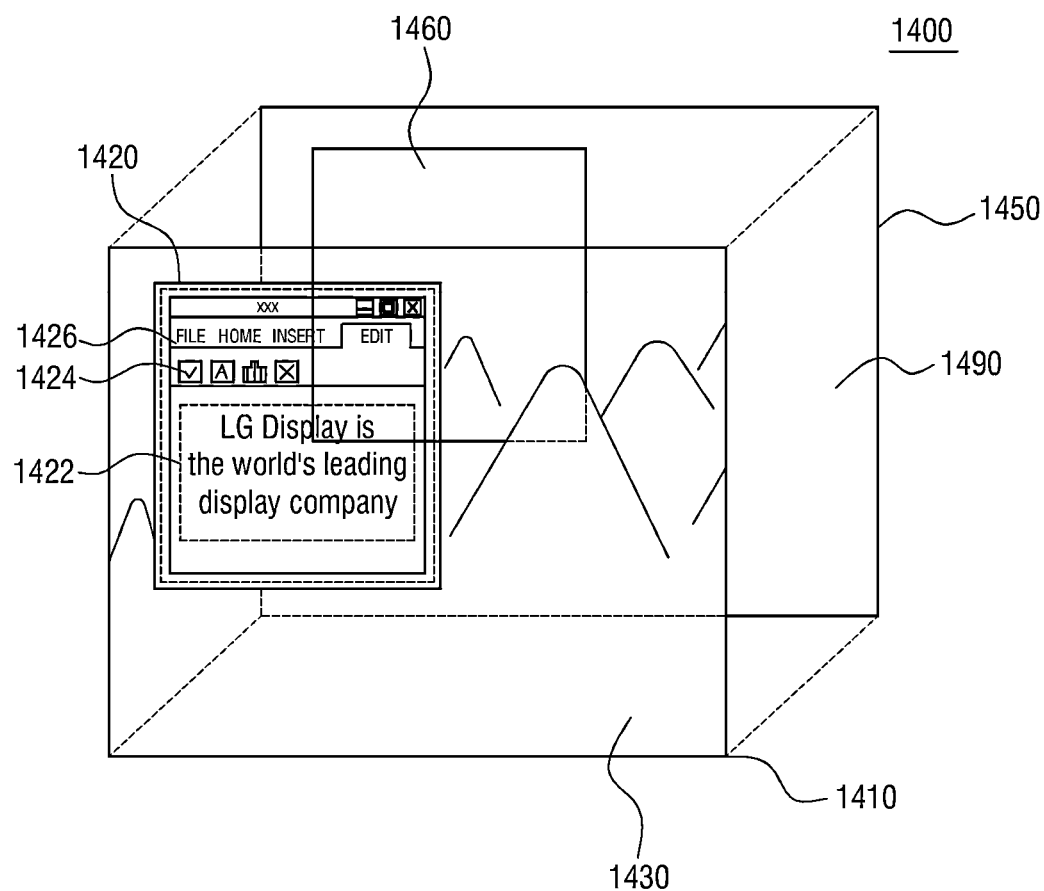
FIG. 14 is a conceptual diagram showing an information area in the method for controlling a transparent display apparatus.

FIG. 14 is a conceptual diagram showing an information area in the method for controlling a transparent display apparatus. Referring to FIG. 14, a transparent display apparatus 1400 includes a transparent display unit 1410 and a light control unit 1450. The transparent display unit 1410 and the light control unit 1450 come in close contact with each other, but FIG. 14 illustrates that the transparent display unit 1410 and the light control unit 1450 are distanced from each other for the sake of convenience in description.

The image displayed on the transparent display unit 1410 is divided into an information area 1420 and a non-information area 1430. The information area 1420 is illustrated as, for example, a program active window of a word processor. The information area 1420 includes a frame 1428, a menu 1426, an icon 1424, and a character area 1422 of the program active window. In an embodiment, the entire program active window may be recognized as the information area 1420. Alternatively, the menu 1426, the icon 1424, and the character area 1422 may be recognized as the information area 1420. Otherwise, only the character area 1422 may be recognized as the information area 1420. Since information of a character is important to maintain the visibility, the area corresponding to the light control unit is preferably controlled to have the lowest transmittance.

The non-information area 1430 is illustrated as a background area of the image. The non-information area 1430 may be a one-color background, or may be an image in which mountains are drawn as shown in FIG. 14. The processing unit determines whether or not the image is information. When it is determined that the image is not information, the image is divided as the non-information area 1430. The processing unit corrects the image of the non-information area 1430 so as to decrease the luminance. By decreasing the luminance of the non-information area 1430, the visibility of the transmitted rear side can be enhanced.

The light control unit 1450 is illustrated by dividing the image into an area 1460 corresponding to the information area and an area 1490 corresponding to the non-information area. The area 1460 corresponding to the information area is controlled so as to allow the transmittance of the light control unit 1450 to be lowered, and the area 1490 corresponding to the non-information area 1430 is controlled so as to allow the transmittance of the light control unit 1450 to be increased Accordingly, the area not including information becomes transparent while the visibility of information desired to display on the transparent display apparatus 1400 is enhanced, so that a transparent background is realized in the transparent display apparatus 1400.

Figure 15:
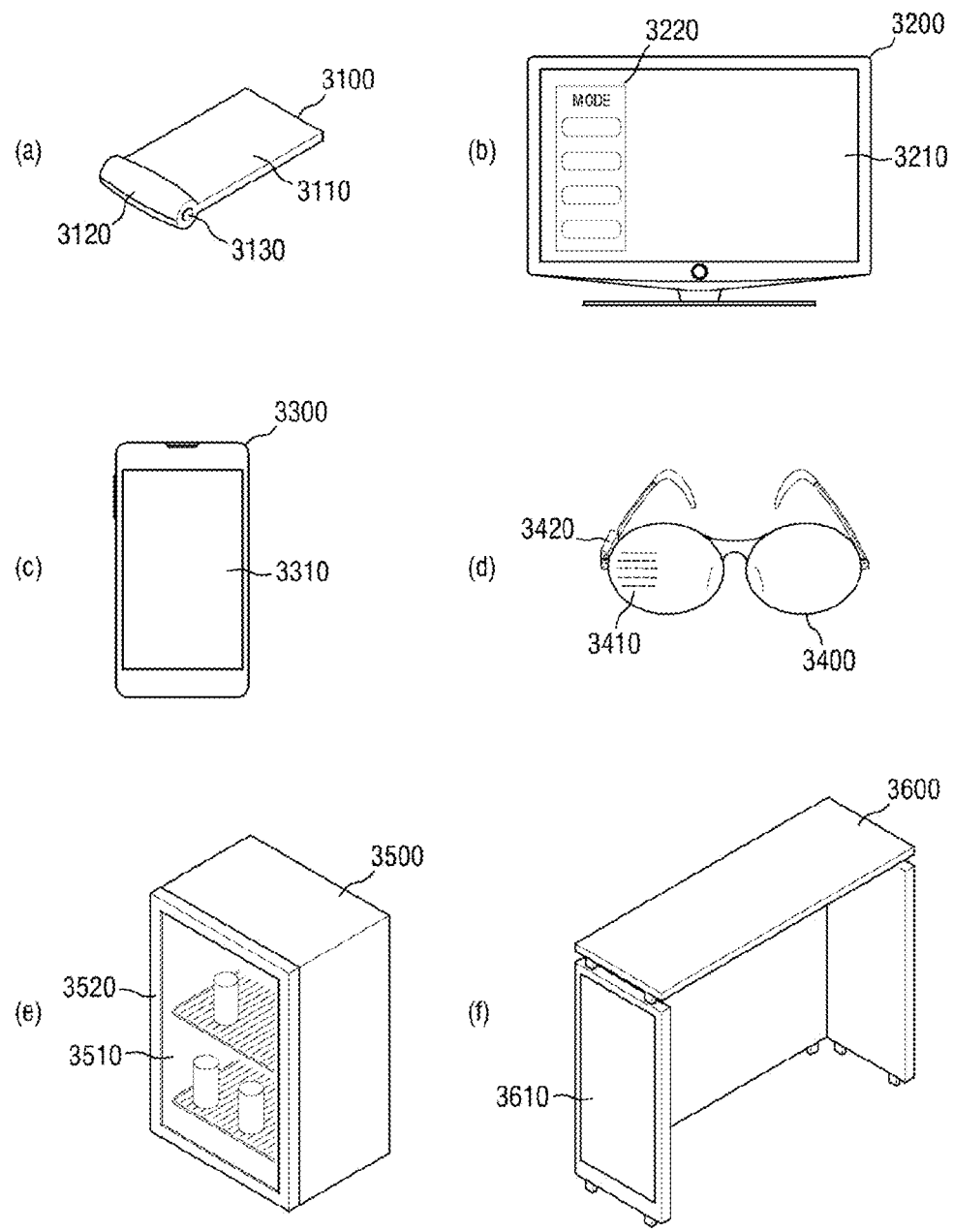
FIG. 15 shows schematic diagrams of apparatuses to which the transparent display apparatus according to the embodiment of the present invention is applicable.

FIG. 15 shows schematic diagrams of apparatuses to which the transparent display apparatus according to the various embodiments of the present invention is applicable.

(a) of FIG. 15 illustrates a case where the transparent display apparatus according to the various embodiments of the present invention is attached to a transparent device 3100. The transparent device 3100 may include a transparent display apparatus 3110, a control unit 3120 and an input unit 3130. The transparent display apparatus 3110 may be formed such that no bezel is formed on at least one surface of the transparent display apparatus 3110 or the minimum number of bezels is formed on the at least one surface thereof. The transparent device 3100 may include an application for utilizing an augmented reality function through the transparent display apparatus 3110 or other functions of the transparent display apparatus 3110 by the control unit 3120. The transparent device 3100 may select various modes for controlling the transparent display apparatus 3110 by using a separate input unit 3130 such as buttons. The modes for controlling the transparent display apparatus 3110 may include a transmissive mode, a shield mode, an e-book mode, and light-transmittance automatic control mode. The separate input unit 3130 may be used when the visibility of the transparent display apparatus 3110 is rapidly deranged by the ambient illuminance environment and it is difficult to select a control window displayed on the transparent display apparatus 3110.

(b) of FIG. 15 illustrates a case where the transparent display apparatus according to the various embodiments of the present invention is used as a transparent device 3200 or a display apparatus of a screen. The transparent device 3200 may be configured to recognize an image through the transparent display apparatus 3210 and an object on a rear side of the transparent display apparatus 3210, or may be configured to be utilized as a double-sided display. That is, the transparent display apparatus 3210 according to the embodiment of the present invention may be used by being attached to another display apparatus.

In this case, a design of the transparent display apparatus may be partially changed depending on a kind of another display apparatus. For example, when another display apparatus is a transparent organic light-emitting display apparatus, in order for the transparent display apparatus 3210 to be a double-sided display apparatus, the transparent display apparatus 3210 may configured to allow a plurality of images to be input. Further, when the double-sided display apparatus is driven, the transparent display apparatus may be driven to be operated in the shield mode in which the light control unit shields the incident light.

The transparent device 3200 may be configured to display a control window 3220 capable of selecting various modes for controlling the transparent display apparatus 3210. The modes for controlling the transparent display apparatus 3210 may include a transmissive mode, a shield mode, an e-book mode, and light-transmittance automatic control mode. The user can accomplish the purpose of using the transparent display apparatus 3210 by appropriately selecting the mode for controlling the transparent display apparatus 3210.

(c) of FIG. 15 illustrates a case where the transparent display apparatus according to the various embodiments of the present invention is used as a display apparatus of a transparent mobile device 3300. (c) of FIG. 15 illustrates that a transparent display apparatus 3310 according to the various embodiments of the present invention is included in the transparent mobile device 3300, but the transparent display apparatus may be provided at a mobile device or a small-sized device such as a smart phone, a cellular phone, a tablet PC, a PDA. When the transparent display apparatus is provided at the small-sized device, since a built-in battery is used without using an external power supply, the elements of the transparent display apparatus 3310 may be designed to be suitable for the limited capacity of the battery. When the transparent display apparatus 3310 is used as the display apparatus of the transparent mobile device 3300, the transparent display apparatus may include a touch-screen for user input of the transparent mobile device 3300. The touch-screen may be formed on the transparent display apparatus 3310, or may be formed in in-cell type. Further, since the rear side of the transparent display apparatus 3310 can be recognized, the touch-screen may be configured to sense touch of both sides of the transparent display apparatus 3310. Furthermore, the mobile device 3300 may include a proximity sensor, and the operation of the mobile device may be changed depending on whether or not the user or the object approaches or the approaching degree.

(d) of FIG. 15 illustrates a case where the transparent display apparatus according to the various embodiments of the present invention is used as a display apparatus of smart glasses 3400. The smart glasses 3400 include a transparent display apparatus 3410 and a control unit 3420. When the transparent display apparatus 3410 according to the various embodiments of the present invention is used in the smart glasses 3400, the transparent display apparatus may be cut off in a rectangular shape or an ellipse shape, and a wiring suitable for various shapes and a driving unit may be set in the transparent display apparatus. Moreover, since a viewing side of the user becomes close to the transparent display apparatus 3410, an optical coating process may be appropriately performed on the transparent display apparatus 3410, or a driving resolution of the image may be appropriately selected.

(e) of FIG. 15 illustrates a case where the transparent display apparatus according to the various embodiments of the present invention is included in a refrigerator 3500. A transparent display apparatus 3510 may be used as a part of a door 3520 of the refrigerator. When the transparent display apparatus 3510 is used as the door 3520 of the refrigerator, the transparent display apparatus 3510 may include a device that reflects energy other than a device that absorbs light or energy. For example, white charged particles other than the black charged particles may be used as the particle charged of the light control unit of the transparent display apparatus 3510. In addition, in order to easily see an object within the refrigerator 3500 on a rear side of the transparent display apparatus 3510, a dehumidification coating process may be performed on the transparent display apparatus 3510.

(f) of FIG. 15 illustrates a case where the transparent display apparatus according to the various embodiments of the present invention is used as an advertisement displaying apparatus 3600 of a bus station. (f) of FIG. 15 illustrates that a transparent display apparatus 3610 according to the various embodiments of the present invention is included in the advertisement displaying apparatus 3600 of a bus station, but the transparent display apparatus may be provided at a fixation device or a large-sized device such as a television or a billboard. Since a power is supplied from an external power supply, the elements of the thin-film transistor may be designed so as to realize higher definition of the transparent display apparatus 3610 due to a stabilized power supply. Further, the advertisement displaying apparatus of a bus station may include a motion sensor capable of interacting with pedestrians. For example, the motion sensor may include TOF (Time of Flight) infrared sensor.

When the transparent display apparatus according to the various embodiments of the present invention is used as a smart window, the transparent display apparatus may include a supporting member for using as at least the smart window, and the supporting member may include all kinds of films such as a film and a protection film that can be used in the smart window. Moreover, a design of the transparent display apparatus may be partially changed depending on a place in which the smart window is provided. For example, when the transparent display apparatus is provided at a high-humidity place such as a toilet, a basin, a shower room, or a kitchen, the light control unit may be designed using moisture-resistance elements.

In addition, when the smart window is provided at a place that is easily exposed to external impact, such as an external wall of a building, a window glass of a building or a window glass of a vehicle, the transparent display apparatus may be designed using elements that easily absorb impact or have impact resistance.

Further, when the transparent display apparatus is used as the smart window, various optical films for reinforcing optical and/or physical characteristics may be attached to the transparent display apparatus. A reflecting film, a diffusing film, a prism film, a lens-pattern composite film, a double illuminance enhancement film, a non-reflecting coat film, an anti-ultraviolet film, or an anti-infrared film may be used to reinforce optical and/or physical characteristics. The smart window to which the transparent display apparatus is attached depending on the reinforced characteristics may be used as a window for a vehicle, a smart door, a projection wall, or a smart mirror.

Combinations of each block of the accompanying block diagram and each step of the flow chart can be implemented by algorithms or computer program instructions comprised of firmware, software, or hardware. Since these algorithms or computer program instructions can be installed in processor of a universal computer, a special computer or other programmable data processing equipment, the instructions executed through a processor of a computer or other programmable data processing equipment generates means for implementing functions described in each block of the block diagram or each step of the flow chart. Since the algorithms or computer program instructions can be stored in a computer available or computer readable memory capable of orienting a computer or other programmable data processing equipment to implement functions in a specific scheme, the instructions stored in the computer available or computer readable memory can produce items involving an instruction means executing functions described in each block of the block diagram or each step of the flow chart. Since the computer program instructions can be installed in a computer or other programmable data processing equipment, a series of operation steps are carried out in the computer or other programmable data processing equipment to create a process executed by the computer such that instructions implementing the computer or other programmable data processing equipment can provide steps for implementing functions described in functions described in each block of the block diagram or each step of the flow chart.

Further, each block or each step may indicate a part of a module, a segment, or a code including one or more executable instructions for implementing specific logical function (s). Furthermore, it should be noted that in some alternative embodiments, functions described in blocks or steps can be generated out of the order. For example, two blocks or steps illustrated continuously may be implemented simultaneously, or the blocks or steps may be implemented in reverse order according to corresponding functions.

In addition, it is possible that a plurality of blocks and a plurality of steps are integrated into one block and one step.

The steps of a method or algorithm described in connection with the embodiments disclosed in the present specification may be embodied directly in hardware, in a software module executed by a processor, or in a combination of the two. The software module may reside in RAM memory, flash memory, ROM memory, EPROM memory, EEPROM memory, register, hard disk, a removable disk, a CD-ROM, or any other form of non-transitory computer readable storage medium known in the art. A storage medium is coupled to the processor such that the processor can read information from, and write information to, the storage medium. Otherwise, the storage medium may be integrated with the processor. The processor and the storage medium may reside in an application-specific integrated circuit (ASIC). The ASIC may reside in a user terminal. Otherwise, the processor and the storage medium may reside as discrete components in a user terminal.

Hereinafter, various characteristics of the transparent display apparatus of the present invention will be described.

According to another characteristic of the present invention, the transmittance control device may be configured to control the transmittance of the area corresponding to the light control unit depending on at least one characteristic of the object of form, shape, color, illuminance, contrast, size, position, contour, a degree of importance, type, and movement.

According to still another characteristic of the present invention, the characteristic of the object may include a type, and when the type is a character, the transmittance control device may be configured to control the transmittance of the area corresponding to the light control unit to have the lowest transmittance.

According to still another characteristic of the present invention, the characteristic of the object may include a size, and when the size is smaller than a predetermined size, the transmittance control device may be configured to control the transmittance of the area corresponding to the light control unit to have the lowest transmittance.

According to still another characteristic of the present invention, the characteristic of the object may include luminance values of a plurality of objects, and the transmittance control device may be configured to control the transmittance of the area corresponding to the light control unit depending on the luminance values.

According to still another characteristic of the present invention, the plurality of first pixels and the plurality of second pixels may be different in the number of pixels and size.

According to still another characteristic of the present invention, the number of the plurality of first pixels may be greater than the number of the plurality of second pixels.

According to still another characteristic of the present invention, the transmittance control device may be configured to analyze the image to divide the image into an area including information and an area not including information and extract the area including information as an object.

According to still another characteristic of the present invention, the area including information may include at least one of a character, an image, an image, a program window, and a predetermined shape.

According to still another characteristic of the present invention, the transmittance control device may be configured to set a surrounding area of the light control unit that extends from the area corresponding to the light control unit and control transmittance of the surrounding area.

According to still another characteristic of the present invention, the surrounding area may be formed by extending from a boundary of the area corresponding to the light control unit to the outside by 1 to 100 pixels for the pixel of the light control unit.

According to still another characteristic of the present invention, the transmittance control device may be configured to control the area corresponding to the light control unit, the surrounding area, and a remaining area of the light control unit corresponding to an area other than the area corresponding to the light control unit and the surrounding area to have different transmittance values.

According to still another characteristic of the present invention, the transmittance control device may be configured to gradually increase or decrease the transmittance of the surrounding area as it is farther from the area corresponding to the light control unit within the surrounding area.

According to still another characteristic of the present invention, the light control unit may include a reflection film layer and may be configured to adjust the transmittance by moving the reflection film layer by an electrostatic force caused by applying an electric field.

According to still another characteristic of the present invention, the light control unit may be configured to adjust the transmittance by the spread of black charged particles in which positions are variable by applying an electric field.

According to still another characteristic of the present invention, the transmittance control device may be configured to extract the object from the image by using at least one algorithm of a template matching algorithm, an edge-based algorithm, a threshold-based algorithm, and an importance map-based algorithm.

Hereinafter, various characteristics of a method for controlling a transparent display apparatus of the present invention will be described.

According to another characteristic of the present invention, the controlling the transmittance of the area corresponding the object may include controlling the transmittance of the area corresponding to the object to be lower than transmittance of an area which comes in contact with the object in order to improve visibility of the object.

According to still another characteristic of the present invention, in the recognizing an object, the image may be divided into an area including information and an area not including information, and the area including information may be recognized as the object.

According to still another characteristic of the present invention, the method for controlling a transparent display apparatus may further include correcting the image so as to decrease luminance of the area not including information, and in the image displayed on the transparent display unit, the luminance of the area not including information may be decreased.

According to still another characteristic of the present invention, the area not including information may include at least one of a character, an image, an image, a program window, and a predetermined shape.

According to still another characteristic of the present invention, a characteristic of the object may include at least one characteristic of the object of form, shape, color, illuminance, contrast, size, position, contour, a degree of importance, type, and movement, and in the controlling the transmittance, the transmittance may be controlled based on the characteristic of the object.

According to still another characteristic of the present invention, the characteristic of the object may include a type, and in the controlling the transmittance, when the type is a character, the transmittance of the area corresponding to the object may be controlled to have the lowest transmittance.

According to still another characteristic of the present invention, the characteristic of the object may include a size, and in the controlling the transmittance, when the size is smaller than a predetermined size, the transmittance of the area corresponding to the object may be controlled to have the lowest transmittance.

According to still another characteristic of the present invention, the method for controlling a transparent display apparatus may further include receiving video data including positional information and contour information of the object in the image, and in the recognizing an object, the object may be recognized based on the positional information and contour information.

According to still another characteristic of the present invention, the recognizing an object may include setting one or more threshold gradation values; recognizing the positional information and contour information of the object by using the one or more threshold gradation values; and recognizing the object on the basis of the positional information and contour information.

According to still another characteristic of the present invention, the method for controlling a transparent display apparatus may further include setting a surrounding area formed by extending from the area corresponding to the object, and the controlling the transmittance may include controlling transmittance of the surrounding area.

According to still another characteristic of the present invention, in the controlling of the transmittance of the surrounding area, the area corresponding to the object, the surrounding area, and a remaining area other than the area corresponding to the object and the surrounding area may be controlled to have different transmittance values.

According to still another characteristic of the present invention, in the controlling of the transmittance of the surrounding area, the transmittance of the surrounding area may be controlled so as to be gradually increased or decreased as it is farther from the area corresponding to the object within the surrounding area.

The embodiments of the present invention have been described in more detail with reference to the accompanying drawings, but the present invention is not limited to the embodiments. It will be apparent to those skilled in the art that various modifications can be made without departing from the technical sprit of the invention. Accordingly, the embodiments disclosed in the present invention are used not to limit but to describe the technical spirit of the present invention, and the technical spirit of the present invention is not limited to the embodiments. Therefore, the embodiments described above are considered in all respects to be illustrative and not restrictive. The protection scope of the present invention must be interpreted by the appended claims and it should be interpreted that all technical spirits within a scope equivalent thereto are included in the appended claims of the present invention.

What is claimed is:

1. A transparent display apparatus, comprising:
a transparent display unit having an emissive area for display of an image and a transmissive area for transmitting at least a portion of external light incident on the transparent display apparatus;
at least one control device to identify an object in the image and control adjustment of the portion of the external light transmitted through the transmissive area of the transparent display unit in an object area corresponding to the object; and
a light control unit overlapping with the transparent display unit, the light control unit having an adjustable transmittance to the external light,
wherein the control device controls adjustment of the portion of the external light transmitted through the transmissive area of the transparent display unit by controlling adjustment of the adjustable transmittance of the light control unit in the object area corresponding to the object, and
wherein the transparent display unit comprises a plurality of first pixels that include the emissive area and the transmissive area and wherein the light control unit comprises a plurality of second pixels.

2. The transparent display apparatus of claim 1, wherein the control device controls adjustment of the adjustable transmittance of the light control unit in the object area based on at least one characteristic of the object.

3. The transparent display apparatus of claim 2, wherein the control device controls adjustment of the adjustable transmittance of the light control unit in the object area based on a size of the object.

4. The transparent display apparatus of claim 2, wherein the control device controls adjustment of the adjustable transmittance of the light control unit in the object area based on a luminance of the object.

5. The transparent display apparatus of claim 2, wherein the control device controls adjustment of the adjustable transmittance of the light control unit in the object area based on a type of the object.

6. The transparent display apparatus of claim 2, wherein the control device controls adjustment of the adjustable transmittance of the light control unit in the object area based on a movement of the object.

7. The transparent display apparatus of claim 2, wherein the control device controls adjustment of the adjustable transmittance of the light control unit in the object area based on a color of the object.

8. The transparent display apparatus of claim 1, wherein plurality of first pixels and the plurality of second pixels are different in number and size.

9. The transparent display apparatus of claim 1, wherein a size of the object area corresponding to the object is same as a size of the object.

10. The transparent display apparatus of claim 1, wherein the object area corresponding to the object is larger than and surrounds a boundary of the object on all sides by a pre-determined number of pixels.

11. The transparent display apparatus of claim 1, wherein the control device identifies the object in the image with an image matching algorithm.

12. The transparent display apparatus of claim 1, wherein the control device identifies the object in the image based on coordinates indicating a position of the object.

13. A transparent display apparatus, comprising:
a transparent display unit having an emissive area for display of an image and a transmissive area for transmitting at least a portion of external light incident on the transparent display apparatus;
at least one control device to identify an object in the image and control adjustment of the portion of the external light transmitted through the transmissive area of the transparent display unit in an object area corresponding to the object; and
a light control unit overlapping with the transparent display unit, the light control unit having an adjustable transmittance to the external light,
wherein the control device controls adjustment of the portion of the external light transmitted through the transmissive area of the transparent display unit by controlling adjustment of the adjustable transmittance of the light control unit in the object area corresponding to the object, and wherein the control device is configured to control the adjustable transmittance of the light control unit to a first transmittance level in a first portion of the object area within a boundary of the object and to control the adjustable transmittance of the light control unit to a second transmittance level different than the first transmittance level in a second portion of the object area outside of the boundary of the object.

14. The transparent display apparatus according to claim 13, wherein the second transmittance level is higher than the first transmittance level.

15. A method of operation in a transparent display apparatus that comprises a light control unit overlapping with a transparent display unit, the method comprising:
    identifying an object in an image, the image for display on an emissive area of the transparent display unit, the transparent display unit also including a transmissive area for transmitting at least a portion of external light incident on the transparent display apparatus;
    displaying the image in the emissive area of the transparent display unit; and
    adjusting the portion of the external light transmitted through the transmissive area of the transparent display unit in an object area corresponding to the object by controlling an adjustable transmittance of the light control unit to a first transmittance level in a first portion of the object area within a boundary of the object and controlling the adjustable transmittance of the light control unit to a second transmittance level different than the first transmittance level in a second portion of the object area outside of the boundary of the object.

16. The method of claim 15, wherein the adjustable transmittance of the light control unit is adjusted based on at least one characteristic of the object.

17. A transparent display apparatus, comprising:
    a transparent display unit having a plurality of first pixels including an emissive area for display of an image and a transmissive area for transmitting at least a portion of external light incident on the transparent display apparatus;
    a light control unit overlapped with the transparent display unit having a plurality of second pixels, the light control unit having an adjustable transmittance to the external light; and
    at least one control device configured to identify an object containing information on the basis of the object's surroundings on the basis of at least one characteristics of the object in the image and determine an area of the light control unit corresponding to the object,
    wherein the at least one control device is configured to control the transmittance of the area of the light control unit corresponding to the object by controlling at least some of the plurality of second pixels corresponding to the object, and
    wherein the at least one control device is configured to control the transmittance of a remaining area of the light control unit other than the area corresponding to the object by controlling certain second pixels corresponding to the remaining area of the light control unit other than the area corresponding to the object.

18. The transparent display apparatus of claim 17, wherein a total number of the first pixels are more than a total number of the second pixels.

19. The transparent display apparatus of claim 17, wherein a size of first pixel is smaller than a size of the second pixel.

20. The transparent display apparatus of claim 17, wherein visible distinguishability between the object and a view behind of the transparent display apparatus to be seen through the transmissive area is increased upon controlling the transmittance of the plurality of the second pixels.

21. The transparent display apparatus of claim 20, wherein the control device controls the adjustable transmittance of the light control unit in the object area based on a luminance of the object.

* * * * *